(12) United States Patent
Das

(10) Patent No.: US 7,724,036 B2
(45) Date of Patent: May 25, 2010

(54) CLOCK GUIDED LOGIC WITH REDUCED SWITCHING

(76) Inventor: Ashutosh Das, 10544 John Way, Cupertino, CA (US) 95014

( * ) Notice: Subject to any disclaimer, the term of this patent is extended or adjusted under 35 U.S.C. 154(b) by 22 days.

(21) Appl. No.: 12/206,668

(22) Filed: Sep. 8, 2008

(65) Prior Publication Data

US 2009/0066369 A1 Mar. 12, 2009

Related U.S. Application Data

(60) Provisional application No. 60/993,003, filed on Sep. 6, 2007.

(51) Int. Cl.
*H03K 19/00* (2006.01)
*H03K 19/096* (2006.01)

(52) U.S. Cl. .............. 326/93; 326/97; 326/98; 327/263; 327/288; 327/299

(58) Field of Classification Search ............ 326/93–98; 327/261–263, 284, 288, 291, 299
See application file for complete search history.

(56) References Cited

U.S. PATENT DOCUMENTS

| | | | | | |
|---|---|---|---|---|---|
| 3,973,139 | A | * | 8/1976 | Dingwall | 377/105 |
| 5,073,726 | A | * | 12/1991 | Kato et al. | 326/24 |
| 5,612,638 | A | * | 3/1997 | Lev | 326/98 |
| 5,889,417 | A | * | 3/1999 | Klass et al. | 326/98 |
| 6,462,582 | B1 | * | 10/2002 | Forbes | 326/98 |
| 6,549,038 | B1 | * | 4/2003 | Sechen et al. | 326/93 |
| 6,624,665 | B2 | | 9/2003 | Kim et al. | |
| 6,972,599 | B2 | * | 12/2005 | Forbes | 326/97 |
| 6,980,033 | B2 | | 12/2005 | Forbes | |
| 2002/0110032 | A1 | * | 8/2002 | Forbes | 365/203 |
| 2005/0068065 | A1 | * | 3/2005 | Wijeratne | 326/98 |

OTHER PUBLICATIONS

Naran Sirisantana et al., "Selectively Clocked Skewed Logic (SCSL): A Robust Low-Power Logic Style for High-Performance Applications", School of Electrical and Computer Engineering, Purdue University, West Lafayette, Indiana, Copyright 2001 ACM1-58113-371-5/01/0008, pp. 267-270.

* cited by examiner

*Primary Examiner*—James H. Cho
*Assistant Examiner*—Jason Crawford
(74) *Attorney, Agent, or Firm*—Perkins Coie LLP

(57) ABSTRACT

Methods and apparatuses for optimizing switching delay in integrated circuits are described. Combinational logic gates are modified with precharge circuitry and instantiated in order to reduce switching transitions of circuit elements in a signal path.

25 Claims, 14 Drawing Sheets

CLOCK GUIDED LOGIC WITH REDUCED SWITCHING

PRIORITY

The present patent application claims priority to and incorporates by reference the corresponding U.S. provisional patent application Ser. No. 60/993,003, entitled, "Concept, Design Technique, and Implementation of the Clock Guided Logic" filed on Sep. 6, 2007.

FIELD OF THE INVENTION

The invention relates to integrated circuits, and more specifically to optimization of integrated circuits.

BACKGROUND OF THE INVENTION

Integrated circuits contain a plurality of signal paths which essentially carry information (data and control signals) across the circuit. Each signal path is made up of a plurality of circuit elements connected together serially (i.e., in series). Each of these signal paths experiences a delay as signals travel across the circuit. These signal path delays occur due to the time required for signals to propagate through each of the plurality of circuit elements from the input to the output of the signal path. Each circuit element has its own switching delay known as the switching delay of a circuit element. This circuit element switching delay is the time required for a circuit element to switch logic states from either a high-to-low logic state (logic 1→0) or from a low-to-high logic state (logic 0→1). The path switching delay is determined by the accumulation of time it takes for a signal to pass through each of the circuit elements in a particular path. This time, in turn, is based on the total switching delay of each circuit element in the path. Paths with the highest number of combined switching delays of circuit elements are known as speed paths or critical paths. These critical paths dictate how fast an integrated circuit can operate. The maximum frequency an integrated circuit can operate at depends directly on how fast signals can propagate across the worst-case critical paths.

FIG. 1A illustrates the switching of static logic states for a series of inverters according to the prior art. Circuit 100 includes a series of connected inverting logic gates 110-1, 110-2, 110-3, 110-4, through 110-n. These inverting logic gates are referred to simply as "inverters" or INV gates. The switching delay experienced by each of these inverters in the path will determine how much time it takes for a signal to propagate from the input IN of inverter 110-1 through to the output (OUT) of inverter 110-n. In the illustrated example, the input to inverter 110-1 switches from a logic state 0 (low) to a logic state 1 (high). This results in the output of inverter 110-1 switching from logic 1 to 0. When the output of logic gate 110-1 transitions from logic 1 to 0, the signal propagates into the input of the next circuit element, inverter 110-2, causing the output of inverter 110-2 to transition from logic 0 to 1. Similarly, logic gate inverter 110-3 causes an inversion on the output that propagates into the input of inverter 110-4 causing an inversion on the output of inverter 110-4, and so on and so forth until the output (OUT) of inverter 110-n is reached. The output of each of the inverters are said to be in an inverting relationship since the output of one inverter causes a corresponding inversion on the output of the next downstream inverter, and so on. Each of these transitions occurs sequentially, one being essentially complete before the other begins. The accumulation of time it takes for each of inverters 110-1 through 110-n to switch (invert) logic states from logic 0 to logic 1, or from logic 1 to logic 0 is the total switching delay of the circuit path shown in FIG. 1A. Hence, FIG. 1A demonstrates the switching of static logic states in the case of a series of inverters, which requires a long switching time before valid data appears at the end of the series of inverters 110-1 through 110-n. The path switching delay is the accumulation of all switching delays of each of the inverters 110-1 through 110-n. This path switching delay occurs not only for inverters, but for any inverting logic functions such as NAND gates, NOR gates, AOI (and-or-invert), OAI (or-and-invert), and etcetera.

Switching delays may be optimized in order to facilitate a signal propagating along a critical path from input to output with reduced switching delays. Conventionally, circuit path delays are optimized in two ways. The first way is to reduce the number of logic stages by combining multiple stages into a single stage. The second way is to reduce the amount of switching delay that a particular stage requires. Such reduction in delay can be accomplished using several techniques known in the art such as transistor resizing, reducing output load, improving input transition time, breaking the complex cells into simpler cells, and etcetera.

Other methods to reduce the switching delays of the logic gates in a path include precharging logic gates (i.e., dynamic logic) and skewing logic gates through transistor resizing. In the case of using dynamic logic, a method for optimizing switching delays of a path in an integrated circuit using dynamic logic gates includes using output prediction logic (OPL) circuits. In OPT circuits every logic gate includes dynamic logic with a precharge circuit. FIG. 1B illustrates a method for optimizing switching delay of logic gates in a circuit path using output prediction logic (OPL) according to the prior art. Circuit 140 includes inverters 150-1, 150-2, 150-3, 150-4, through 150-n. Each inverter includes clock inputs CK 160-1, CK 160-2, CK 160-3, CK 160-4, through CK 160-n respectively that are supplied to precharge circuits in each inverter (not shown) to precharge the output of all the logic gates to a certain value (usually logic=1) during a precharge phase of the clock inputs. In order to facilitate the OPL method, delayed clocks with a small difference in delay are provided to enable each stage in succession so that a reduced number of outputs potentially switch states. It is noted that, because the logic gates are precharged to logic 1, switching of the logic states is avoided on the output of logic gates 150-2 and 150-4. As a result, OPL is faster than the regular static logic gates shown in FIG. 1A.

U.S. Pat. No. 6,549,038 entitled, "Method of High Performance CMOS Design," discloses optimizing signal path delays using the OPL method. However, in OPL circuits there is a somewhat cumbersome requirement of clock signal generation with a very small delay difference between two consecutive logic stages that results in the need to design each clock path with some precision. The generation of clocks with such small delay difference is not straight forward and requires complicated techniques like Delay Locked Loops (DLLs) and carefully designed clock networks. Secondly, the need to supply every stage with a separate clock signal adds to a substantial clocking overhead in the design that requires extra metal resources and careful routing. Also, there are serious concerns about sensitivity to process variation and noise since any significant glitching variation could trigger a regenerative cascading effect across the path. These issues and possibly others may give rise to adoption challenges among the IC design community for this technique. U.S. Pat. No. 6,980,033 entitled, "Pseudo CMOS Dynamic Logic With Delayed Clocks," discloses circuitry similar to the OPL, technique, but using pseudo-CMOS logic gates instead of CMOS.

SUMMARY OF THE DESCRIPTION

At least certain embodiments describe apparatuses and machine-readable media to optimize path switching delay in an integrated circuit. These apparatuses and machine-readable media may include any portion of a signal path in which every Nth logic element is a Clock Guided Logic (CGL) element, where each CGL element comprises either an evaluate-high (EVH) element or evaluate-low (EVL) element, and where the CGL element is alternated between EVH and EVL elements in cases where N is even, and where the CGL element is either exclusively an EVH element or exclusively an EVL element in cases where the N is odd.

Other embodiments describe methods and computer-readable media to optimize path switching delay in an integrated circuit including instantiating a CGL element at every Nth logic stage in any portion of a signal path in the integrated circuit and precharging an output of each CGL element so that either a first N elements in the signal path are sensitized to switch logic states during an evaluate phase of a clock input and a second N elements avoid switching logic states during the evaluate phase, or the first N elements in the signal path avoid switching logic states during the evaluate phase of the clock input and the second N elements are sensitized to switch logic states during the evaluate phase.

BRIEF DESCRIPTION OF THE DRAWINGS

A better understanding of at least certain embodiments of the invention can be obtained from the following detailed description in conjunction with the following drawings, in which.

DETAILED DESCRIPTION

A method and apparatus for optimizing switching delays in an integrated circuit is described. In at least certain embodiments, methods, apparatuses, and computer-readable media to reduce circuit path switching delay called Clock Guided Logic (CGL) is described. This description is applicable in integrated circuits as well as other areas where the delay through multi-level switching elements may be optimized. Throughout the description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of embodiments of the present invention. Although CMOS-type gates are described herein, this is given for ease of explanation and not by way of limitation since any type of switch-based logic gates is considered to be within the scope of this description including gates formed by using BJTs, JFETs, IGFETs, IGBTs, analog, RF, vacuum tubes, carbon nano-tubes, and etcetera. Although some of the gates described herein use CMOS logic other circuit techniques like pseudo-CMOS, dynamic logic, or pass-gate logic may be substituted partially or completely.

Figure 1A:
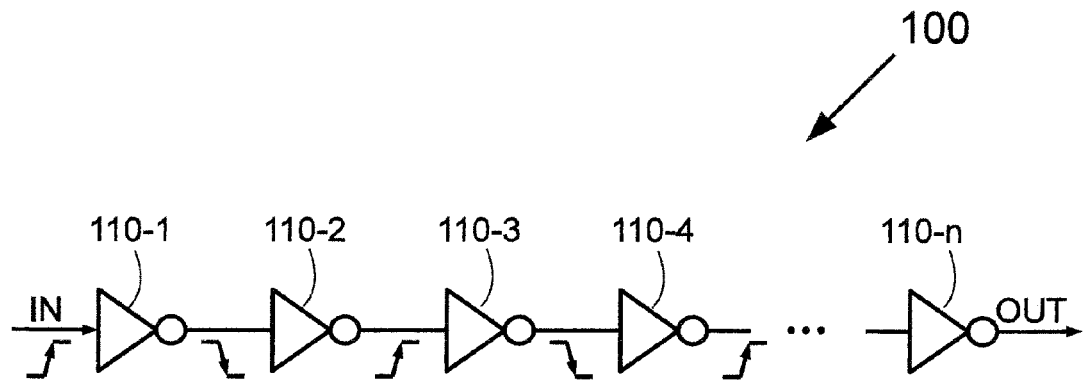
FIG. 1A illustrates the switching of static logic states for a series of inverters according to the prior art.
Figure 1B:
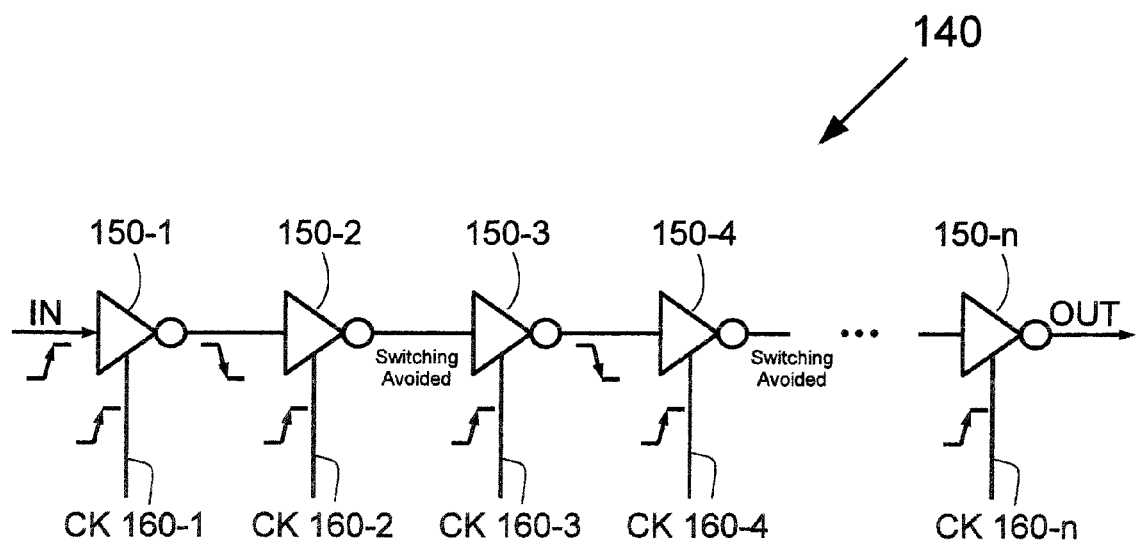
FIG. 1B illustrates a method for optimizing switching delay of logic gates in a circuit path using output prediction logic (OPL) according to the prior art.
Figure 2:
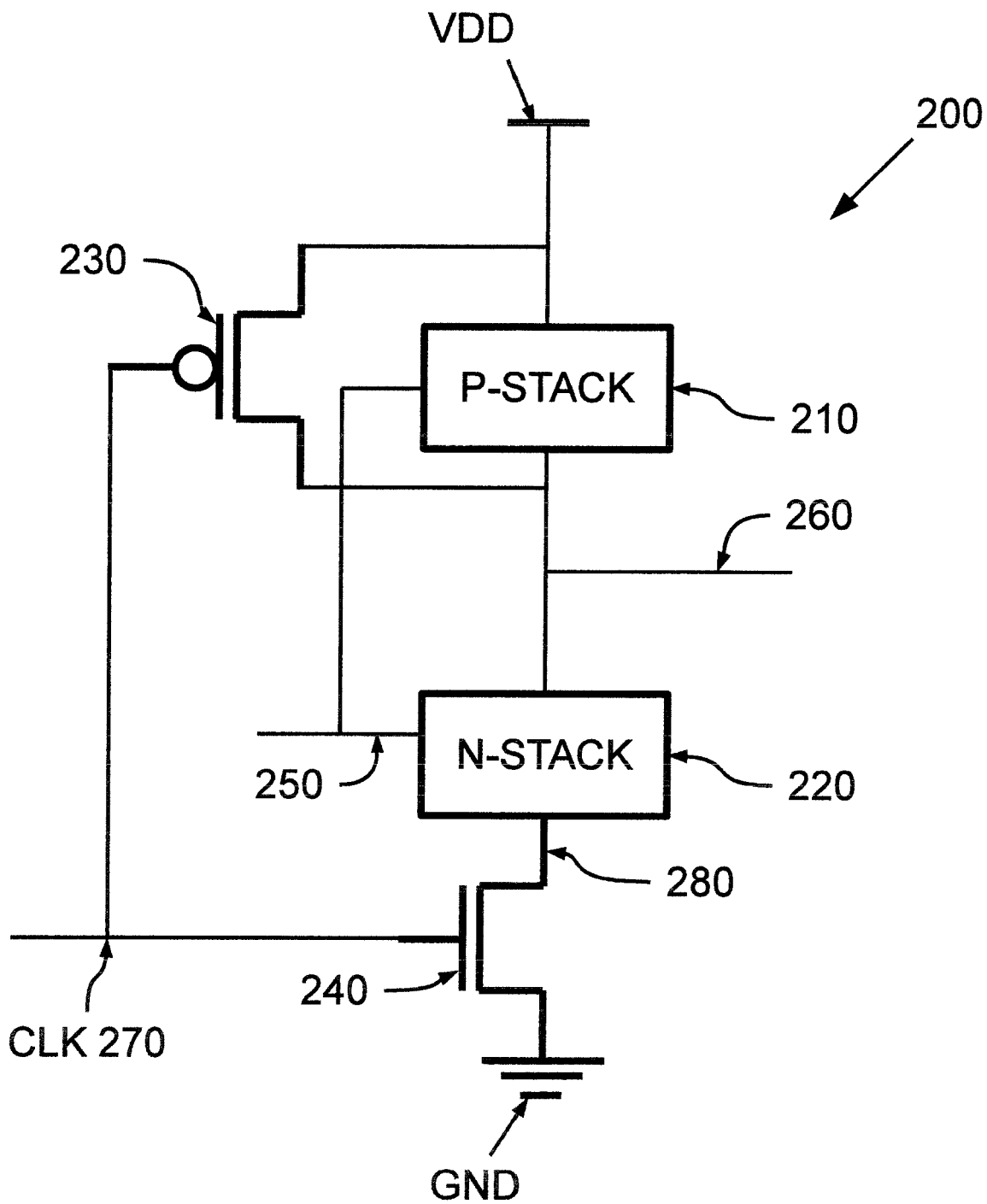
FIG. 2 illustrates an evaluate-high (EVH) logic gate configuration with an arbitrary function according to an exemplary embodiment of the invention.

FIG. 2 illustrates an evaluate-high (EVH) logic gate configuration with an arbitrary function according to an exemplary embodiment of the invention. FIG. 2 shows the first of two types of modifications to the regular (REG) CMOS-based combinational logic gates. In FIG. 2, p-stack 210 and n-stack 220 show regular PMOS and NMOS transistor-stacks, respectively, together forming a CMOS gate when connected at the output 260 of logic gate 200 and having single or multiple inputs 250. The p-stack 210 and n-stack 220 may implement any arbitrary logic functions. In the illustrated embodiment, logic gate 200 is shown with a single input 250; however, any number of inputs from a single input to multiple inputs is included within the scope of this description.

The modification to gate 200 includes a PMOS transistor 230 added in parallel to p-stack 210 between the power VDD and the output 260 of the logic gate 200, and an NMOS transistor 240 added in series to n-stack 220 between the source region 280 of the n-stack 220 and electrical ground GND. The gate inputs of the transistors 230 and 240 are connected to the clock signal CLK 270. When CLK 270, is high (logic 1), the NMOS transistor 240 switches ON and the PMOS transistor 230 switches OFF. In this state, the logic gate 200 functionality reduces to the normal CMOS logic functionality implemented by the PMOS and NMOS transistor-stacks 210 and 220 respectively. This is called the "evaluate-phase," meaning that when CLK 270 is high, the regular CMOS functionality is "evaluated" based on the input(s) to produce an output. When CLK 270 is low (logic 0), on the other hand, the NMOS transistor 240 switches OFF and the PMOS transistor 230 switches ON. In this state, the output 260 of the logic gate 200 is precharged to high (logic 1) regardless of the state (logic value) at the input 250. This is called the "precharge-phase." This type of modified gate is referred to as an evaluate-high (EVH) logic gate (evaluates when the clock signal is high).

Figure 3:
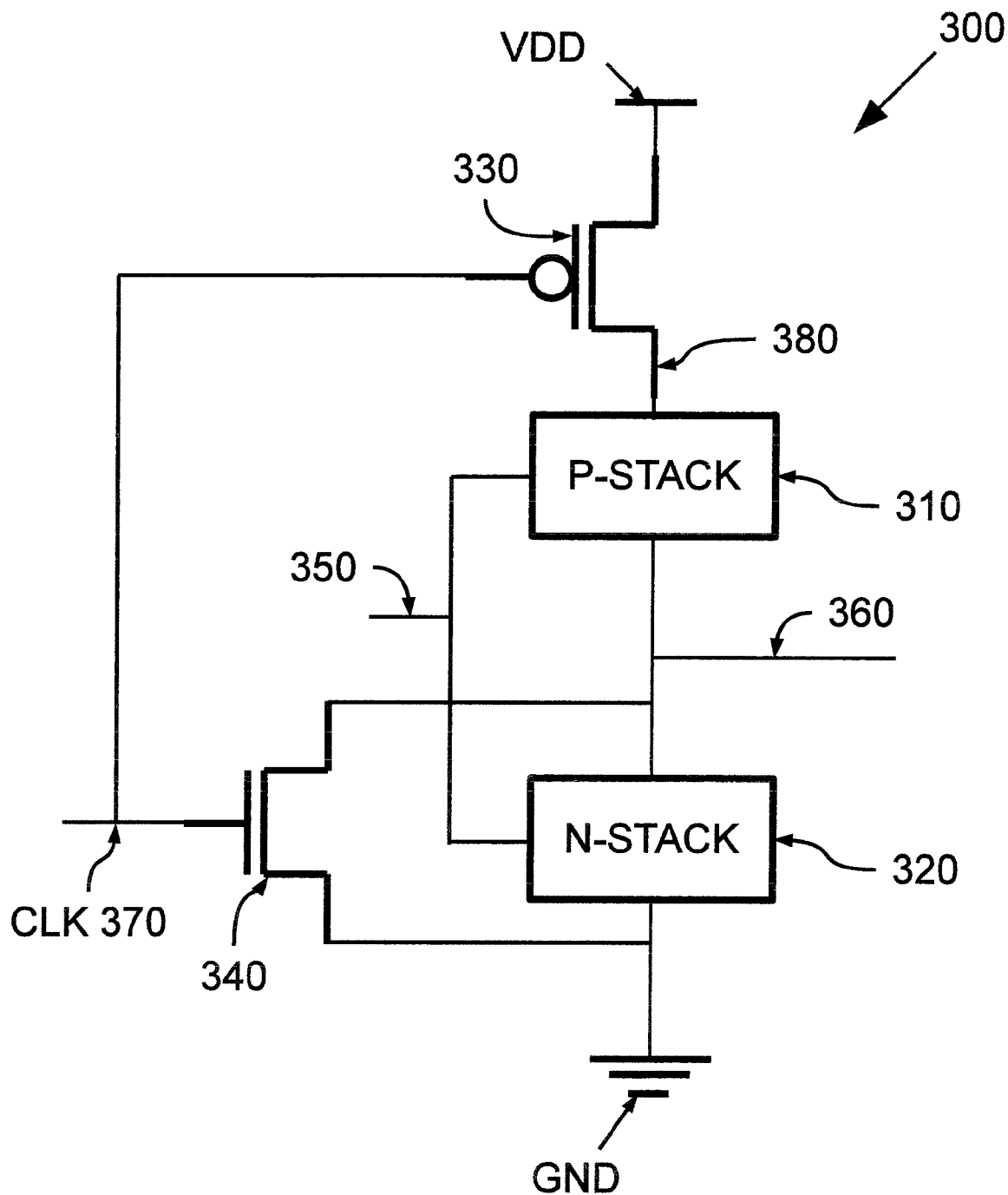
FIG. 3 illustrates an evaluate-low (EVL) logic gate configuration with an arbitrary function according to an exemplary embodiment of the invention.

Similarly, FIG. 3 illustrates an evaluate-low (EVL) logic gate configuration with an arbitrary function according to an exemplary embodiment of the invention. FIG. 3 shows the second of two types of modifications to the regular (REG) CMOS-based combinational logic gates. In FIG. 3, p-stack 310 and n-stack 320 show regular PMOS and NMOS transistor-stacks respectively, together forming a CMOS gate when connected at the output 360, and having single or multiple inputs 350. The p-stack 310 and n-stack 320 may implement any arbitrary logic functions. The modifications to this gate include a PMOS transistor 330 added in series to p-stack 310 between power VDD and the source region 380 of p-stack 310, and an NMOS transistor 340 added in parallel to n-stack 320 between the output 360 and ground GND. The gate inputs of the transistors 330 and 340 are connected to the clock signal CLK 370. When CLK 370 is low, the NMOS transistor 340 switches OFF and the PMOS transistor 330 switches ON. In this state, the gate functionality of logic gate 300 reduces to the normal CMOS logic function implemented by the PMOS and NMOS transistor-stacks 310 and 320, respectively. This is the evaluate-phase. When CLK 370 is high the NMOS transistor 340 switches ON and the PMOS transistor 330 switches OFF. In this state, the output 360 of the logic gate 300 is precharged to logic 0 regardless of the logic value at the input(s) 350. This is the precharge-phase. This type of modified gate is referred to as and evaluate-low (EVL) logic gate (evaluates when the clock signal is low). The term Clock Guided Logic (CGL) gate may be used to refer to either an EVL-type or EVH-type logic gates for convenience. Also regular static logic gates are herein referred to as REG logic gates.

I. 2-CGL Clock Guided Logic

Figure 4A:
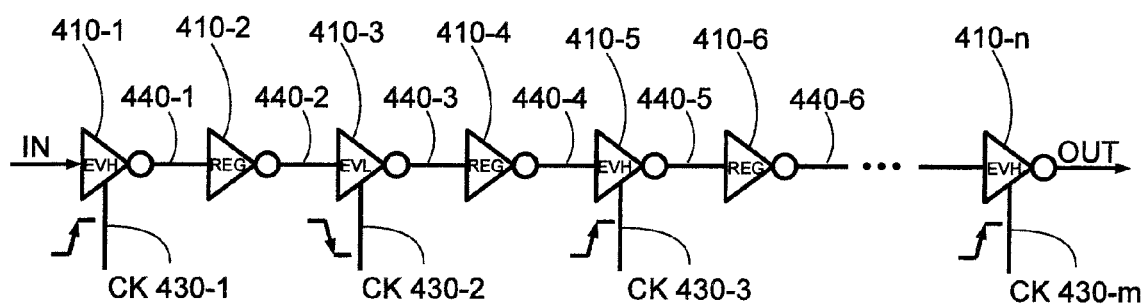
FIG. 4A illustrates a multi-level Clock Guided Logic (CGL) circuit with every 2nd logic gate clocked (2-CGL) according to an exemplary embodiment of the invention.

FIG. 4A illustrates a multi-level Clock Guided Logic (CGL), circuit with every 2nd logic gate clocked (2-CGL) according to an exemplary embodiment of the invention. FIG. 4A includes a series of inverters 410-1, 410-2, 410-3, 410-4, 410-5, 410-6 through 410-n from the input IN to the output OUT. Each of the series of inverters includes an output 440-1, 440-2, 440-3, 440-4, 440-5, 440-6, through 440-n respectively. Additionally, each of the CGL gates 410-1, 410-3, 410-5, through 410-n includes a clock input CK 430-1, CK 430-2, CK 430-3, through CK 430-m respectively.

As before, each CGL gate may include any arbitrary inverting logic function having single or multiple inputs. For simplicity only one input per gate is shown. In the illustrated embodiment, the 2-CGL technique is demonstrated where every 2nd logic gate uses EVH and EVL type gates alternatively (EVH and EVL gates are described in FIGS. 2 and 3 respectively). More specifically, in the illustrated embodiment, logic gates 410-1, 410-5, through 410-(4n+1) (where, n=0, 1, 2, 3, . . . ) are EVH-type gates, logic gates 410-3, 410-7, through 410-(4n+3) (where, n=0, 1, 2, 3, . . . ) are EVL-type gates, and logic gates 410-2, 410-4, 410-6, through 410-(2n+2) (where, n=0, 1, 2, 3, . . . ) are REG combinational logic gates. In at least certain embodiments, a series of logic gates, EVH-REG-EVL-REG-EVH-REG-EVL- . . . , is formed in which every 2nd gate alternates between EVH-type gates and EVL-type gates. In the illustrated embodiment, the multi-level path has the first element as EVH-type logic gate. However, this is given by way of illustration and not of limitation as signal paths may begin with any type gate including EVH-type, EVL-type, or REG logic gates. That is, the 2-CGL method include the sequence, EVH-REG-EVL-REG-EVH-REG-EVL- . . . , beginning at any point in an integrated circuit path as long as subsequent logic gates follow the described sequence. Any portion of a signal path in an integrated circuit that includes this sequence is considered covered herein by the teachings of this description. This type of CGL circuit technique is referred to as the 2-CGL technique since every 2nd gate uses a CGL, gate.

Figure 4B:
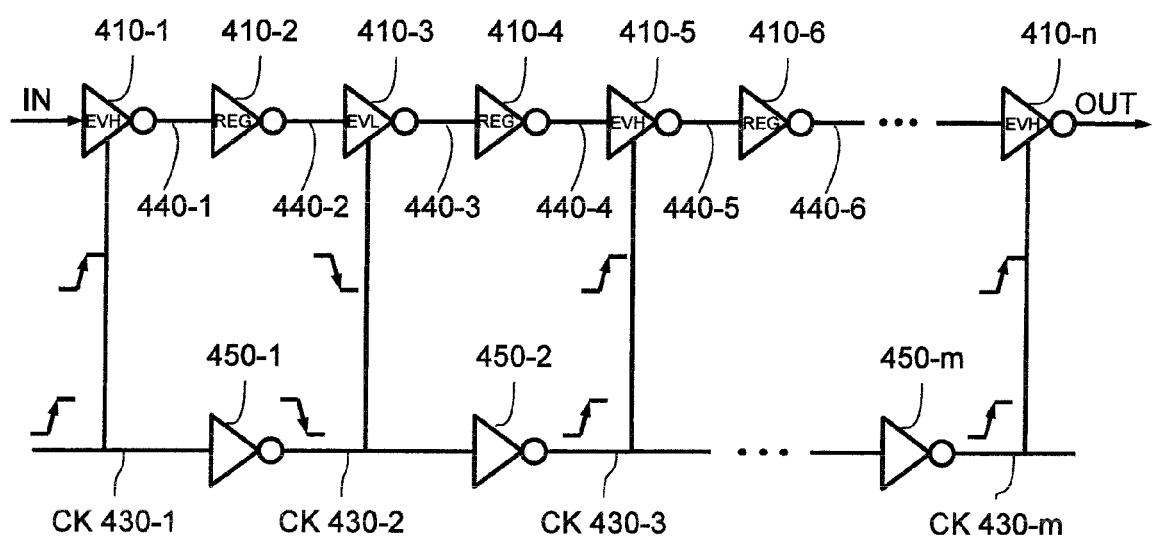
FIG. 4B illustrates further details of a multi-level Clock Guided Logic (CGL) circuit using 2-CGL, according to an exemplary embodiment of the invention.

In the 2-CGL method signal paths may be optimized so that switching delay is minimized. This is accomplished by configuring circuit paths of integrated circuits in the described manner so that the number of logic transitions required by logic gates in the circuit path is reduced. In at least certain embodiments, the clock signals driving any EVH or EVL-type logic gates are delayed with an inverting relationship with respect to the clock signals driving the preceding EVL or EVH type gates respectively. FIG. 4B illustrates a multi-level Clock Guided Logic (CGL) circuit using 2-CGL according to an exemplary embodiment of the invention. FIG. 4B includes a series of inverters 410-1, 410-2, 410-3, 410-4, 410-5, 410-6 through 410-n from the input IN to the output OUT. Each of the series of inverters includes an output 440-1, 440-2, 440-3, 440-4, 440-5, 440-6, through 440-n respectively. Additionally, each of the CGL gates 410-1, 410-3, 410-5, 440-6, through 410-n includes a clock input CK 430-1, CK 430-2, CK 430-3, through CK 430-m respectively. In FIG. 4B, clock signal CK 430-1 is a supplied clock (such as a system or external clock or an internal clock tree network) and inverters 450-1, 450-2, through 450-m are connected in series to generate the clock signals CK 430-2, CK 430-3, through CK 430-m from the supplied clock signal CK 430-1. In such an embodiment, clock signals may be generated with case by using a simple chain of inverters connected together in series to form the clock path. The ease of clock generation is one of the advantages of the CGL method. The arrival times of the clock signals to the CGL gates may be chosen to facilitate the correct functioning and optimal delay of a multi-level circuit. The circuit shown in FIG. 4B is given by way of example and not of limitation as various other circuit methods and schemes to generate clock signals are possible and contemplated within the teachings of this description. Clock signals such as CK 430-1 may be generated by any conventional methods.

During the precharge phase of the 2-CGL circuit shown in FIG. 4B, EVH gates are precharged to logic 1 (high) and EVL gates are precharged to logic 0 (low). Thus, the output 440-1 of EVH gate 410-1 is precharged to logic 1 and the output 440-3 of EVL gate 410-3 is precharged to logic 0. The output 440-2 of the first downstream REG gate 410-2 following the EVH gate 410-1 switches to logic state 0 and the output 440-4 of the first downstream REG gate 410-4 following the EVH gate 410-3 switches to logic state 1. More specifically in FIG. 4B, logic gates 410-1, 410-5, through 410-(4n+1) (where, n=0, 1, 2, 3 . . . ) are precharged to 1 and gates 410-3, 410-7, through 410-(4n+3) (where n=0, 1, 2, 3 . . . ) are precharged to logic state 0.

During the evaluate phase, the clock signals CK 430-1, CK 430-2, through CK 430-m trigger the gates to evaluate one-by-one in sequence. The gate 410-1 may either transition to logic 0 or stay at logic 1 depending on the state of the input IN. In the case where the input IN is logic 1, the output 440-1 of logic gate 410-1 should switch to logic 0 and the output 440-2 of logic gate 410-2 should switch to logic 1, the output 440-3 of logic gate 410-3 should switch to logic 0, and the output 440-4 of logic gate 410-4 should switch to logic 1. However, due to the precharge circuits contained within the CGL gates, some logic gates may avoid switching. In at least certain embodiments, either the first two logic gates (e.g., 410-1, 410-2) switch logic states, or the second two logic gates 410-3 and 410-4 switch logic states, but not both. It can be seen, therefore, that only about one half of the logic gates need to switch for any given input. This reduction in the number of gate output transitions results in an optimization of the delay across the circuit. Thus, the 2-CGL method can utilize the CGL gates with the proper clock signal polarities to decrease the overall switching delay of signal paths in an integrated circuit.

Figure 4C:
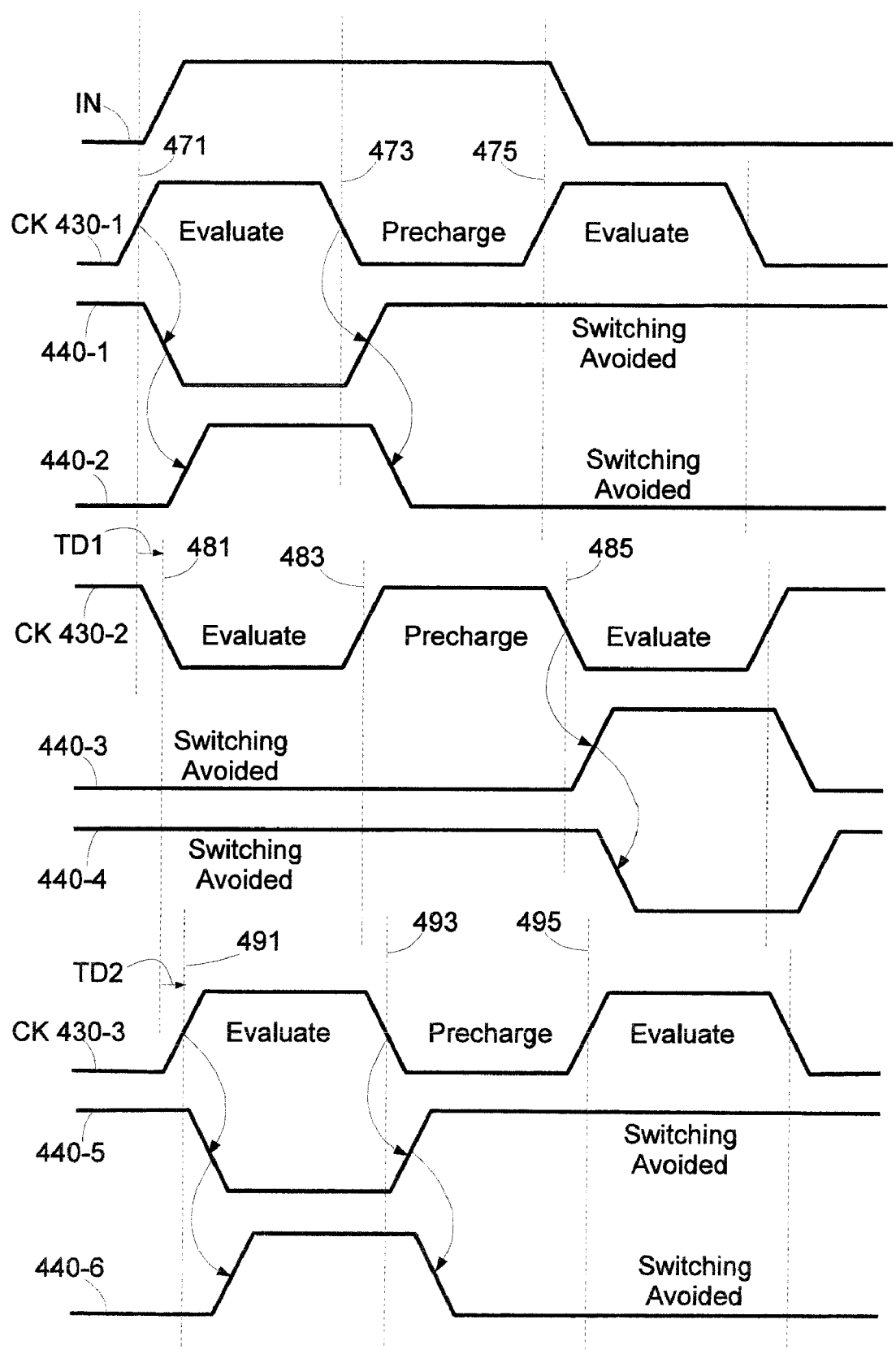
FIG. 4C illustrates a timing diagram demonstrating the operation of the multi-level Clock Guided Logic (CGL) circuit of FIG. 4B according to an exemplary embodiment of the invention.

FIG. 4C illustrates a timing diagram demonstrating the operation of the multi-level (Crock Guided Logic (CGL)) circuit of FIG. 4B according to an exemplary embodiment of the invention. FIG. 4C includes the waveforms of clock signals CK 430-1, CK 430-2, and CK 430-3 and the waveforms of outputs 440-1, 440-2, 440-3, 440-4, 440-5 and 440-6 corresponding to inverters 410-1, 410-2, 410-3, 410-4, 410-5 and 410-6 respectively shown in FIG. 4B.

Referring to FIG. 4B, clock signal CK 430-1 is clocking EVH gate 410-1. At transition 471, the clock signal CK 430-1 clocking EVH gate 410-1 transitions from logic 0 to 1 and the output 440-1 of EVH gate 410-1 goes into the evaluate phase since logic gate 410-1 is an EVES logic gate and EVH logic gates evaluate when the clock input is logic 1. In the evaluate phase, the logic function of the EVH gate 410-1 is evaluated based on the value of the input (e.g., input "IN" of the illustrated embodiment of FIG. 4B). For purposes of explanation, the input IN of EVH gate 410-1 is assumed to be logic 1 during this evaluate phase since the input IN switches to logic 1 at almost the same time as CK 430-1 transitions from logic 0 to logic 1. In this evaluate phase, EVH gate 410-1 evaluates its logic function. Since EVH gate 410-1 is an inverting logic gate, output 440-1 of EVH gate 410-1 switches from logic 1 to 0 whenever the input IN is at logic 1. Additionally, when the output 440-1 of logic gate 410-1 switches from logic 1 to 0, the output 440-2 of logic gate 410-2 switches from logic 0 to 1 because the output 440-2 of logic gate 410-2 is in an inverting relationship with output 440-1 of logic gate 410-1.

Clock signal CK 430-2 is in an inverting relationship with the clock signal CK 430-1. In the illustrated embodiment, clock signal CK 430-2 is clocking EVL gate 410-3 of FIG. 4B. At transition 471, clock signal CK 430-1 switches from logic 0 to 1 and clock signal CK 430-2 switches from logic 1 to 0 at transition 481. There is a delay of the clock signal CK 430-2 with respect to clock signal CK 430-1 shown as TD1 in FIG. 4C. This delay is the propagation delay through inverter gate 450-1 shown in FIG. 4B, which is driving the clock signal CK 430-2. The delay TD1 can be adjusted by adjusting the delay of the clock path. For example, TD1 can be adjusted by resizing inverter 450-1 driving clock signal CK 430-2 shown in FIG. 4B. The clock and signal path delays can also be adjusted by other circuit methods including modifying the loading at the gate outputs, inserting additional gate stages, modifying sizes of gates, modifying functionality of gates, modifying the supply voltage, modifying the threshold voltage of gate transistors, modifying the fabrication process, technology, and etcetera.

The arrival times of the clock signals to the CGL gates may be chosen to facilitate the correct functioning and optimal performance of a multi-level circuit. The ease of clock generation is one of the advantages of the CGL method. The clock delays and logic gate delays may be chosen to yield the best results for any combination of circuit parameters including timing, power, area, and reliability. Additionally, the clock delays can be adjusted during the operation of the circuit by dynamically adjusting the clock delays or by fixing the clock delays before the commencement of normal circuit operation. The clock delays can be designed and modified by employing various known circuit techniques. Any such techniques are contemplated within the teachings of this description.

At transition 481, the clock signal CK 430-2 clocking EVL gate 410-3 transitions from logic 1 to 0 and the output 440-3 of EVL gate 410-3 goes into the evaluate phase since logic gate 410-3 is an EVL gate and EVL gates go into the evaluate phase when the clock input is at logic 0. In this evaluate phase, the logic function of the EVL gate 410-3 is evaluated based on the value of its inputs. In this case, the input of EVL, gate 410-3 is the output 440-2 of logic gate 410-2 from the previous stage. In the illustrated embodiment, the output 440-2 of logic gate 410-2 is at logic 1. Thus, EVL gate 410-3 would switch to logic 0 since EVL gate 410-3 is in an inverting relationship with output 440-2 of logic gate 410-2. However, the output 440-3 of EVL gate 410-3 avoids switching because the output 440-3 of EVL gate 410-3 was already at the correct state of logic 0 based on the previous precharge phase (not shown). That is, during the previous precharge phase (not shown) the value at output 440-3 of EVL gate 410-3 was precharged to logic 0. As a result, EVL gate 410-3 avoids switching to logic 0. This is pictured in FIG. 4C. Likewise, the output 440-4 of downstream logic gate 410-4 avoids switching because output 440-4 of logic gate 410-4 was already at logic 1 due to the previous precharge phase of EVL gate 410-3. As a result, logic gates 410-3 and 410-4 avoid switching during this evaluate phase.

At transition 473, the clock signal CK 430-1 clocking EVH gate 410-1 transitions from logic 1 to 0. This transition causes EVH gate 410-1 to go into the precharge phase since logic gate 410-1 is an EVH gate and EVH gates go into the precharge phase during the low phase of the clock input (i.e., logic 0). The output 440-1 of logic gate 410-1 is precharged to logic 1 since gate 410-1 is an EVH-type gate. The output 440-2 of downstream logic gate 410-2 correspondingly switches from logic 1 to logic 0 during the precharge phase.

Likewise, at transition 483, the clock signal (OK 430-2 clocking EVL gate 410-3 transitions from logic 0 to 1. This transition also causes EVL gate 410-3 to go into the precharge phase. This is because logic gate 410-3 is an EVL gate and EVL gates go into precharge during the high-phase of the clock input. EVL gate 410-3 precharges to logic 0 since gate 410-3 is an EVL-type gate. Once again, the output 440-3 of EVL gate 410-3 was already at logic 0 based on the previous evaluate phase, and therefore, EVL gate 410-3 avoids switching during this precharge phase at transition 483. Correspondingly, the output 440-4 of downstream logic gate 410-4 avoids switching logic states during this precharge phase because the output 440-4 of downstream logic gate 410-4 was already at logic 1.

At transition 475, CK 430-1 clocking EVH gate 410-1 transitions again from logic 0 to 1 placing EVH gate 410-1 back into the evaluate phase. This time, however, the input IN of EVH gate 410-1 has changed. For purposes of explanation, the input IN of EVH gate 410-1 is assumed to be at logic 0 during this evaluate phase because the input IN switches from logic 1 to logic 0 at almost the same time as CK 430-1 transitions from logic 0 to 1. Since the input IN of EVH gate 410-1 is now at logic 0, the output 440-1 of EVH gate 410-1 should switch to logic 1. However, this time the output 440-1 of EVH gate 410-1 avoids switching logic states because output 440-1 of EVH gate 410-1 was already at the correct state of logic 1 based on the previous precharge phase (at transition 473). Likewise, output 440-2 of logic gate 410-2 avoids switching because output 440-2 of logic gate 410-2 was already at the correct state of logic 0 from the previous precharge phase.

In contrast, at transition 485, CK 430-2 clocking EVL gate 410-3 transitions from logic 1 to 0 placing EVL gate 410-3 into the next evaluate phase. This time, however, the input of EVL gate 410-3 (i.e., 440-2 of logic gate 410-2) previously switched to logic 0. Accordingly, during this evaluate phase, EVL gate 410-3 evaluates by switching from logic 0 to 1. Likewise, downstream logic gate 410-4 evaluates by switching from logic 1 to 0 since logic gate 410-4 is in an inverting relationship with EVL gate 410-3.

In this manner, the outputs 440-3, 440-2, 440-3 and 440-4 of logic gates 410-3, 410-2, 410-3, and 410-4 respectively are precharged in such a way so that either logic gates 410-1 and 410-2 switch logic states or logic gates 410-3 and 410-4 switch logic states during an evaluate phase, but not both. In the illustrated embodiment, the outputs 440-1 and 440-2 of logic gates 410-1 and 410-2 respectively are precharged so that logic gates 410-1 and 410-2 switch logic states during the evaluate phase at transition 471 of CK 430-1 and avoid switching logic states during the next evaluate phase at transition 475 of CK 430-1. Likewise, the outputs 440-3 and 440-4 of logic gates 410-3 and 410-4 respectively are precharged so that logic gates 410-3 and 410-4 avoid switching logic states during the evaluate phase at transition 481 of CK 430-2 and switch logic states during the next evaluate phase at transition 485 of CK 430-2.

This sequence of transitions continues throughout an entire signal path when 2-CGL is implemented. For example, when clock signal CK 430-2 transitions from logic 1 to 0, clock signal CK 430-3 switches from logic 0 to 1 after delay TD2. The transitions of outputs 440-5 and 440-6 of logic gates 410-5 and 410-6 respectively are shown at the bottom of FIG. 4C. By examining FIG. 4C, it can be seen that the pattern with respect to the set of gates 440-1, 440-2, 440-3 and 440-4 repeats itself with respect to gates 440-3, 440-4, 440-5, and 440-6, and so on. Thus, in the 2-CGL configuration, either the first set of two logic gates switches or the second set of two logic gates switches, but not both. In at least certain embodiments, therefore, the 2-CGL method minimizes path switching delay by reducing switching of logic gates. Either the first set of logic gates (e.g., 410-1 and 410-2) switch logic states or the second set of logic gates (e.g., 410-3 and 410-4) switch logic states, but not both sets. By examining both cases, it may be seen that half of the gate outputs switch logic states and the other half avoid switching. This reduction in the number of gate output transitions results in an optimization of the path switching delay of the circuit.

Figure 4D:
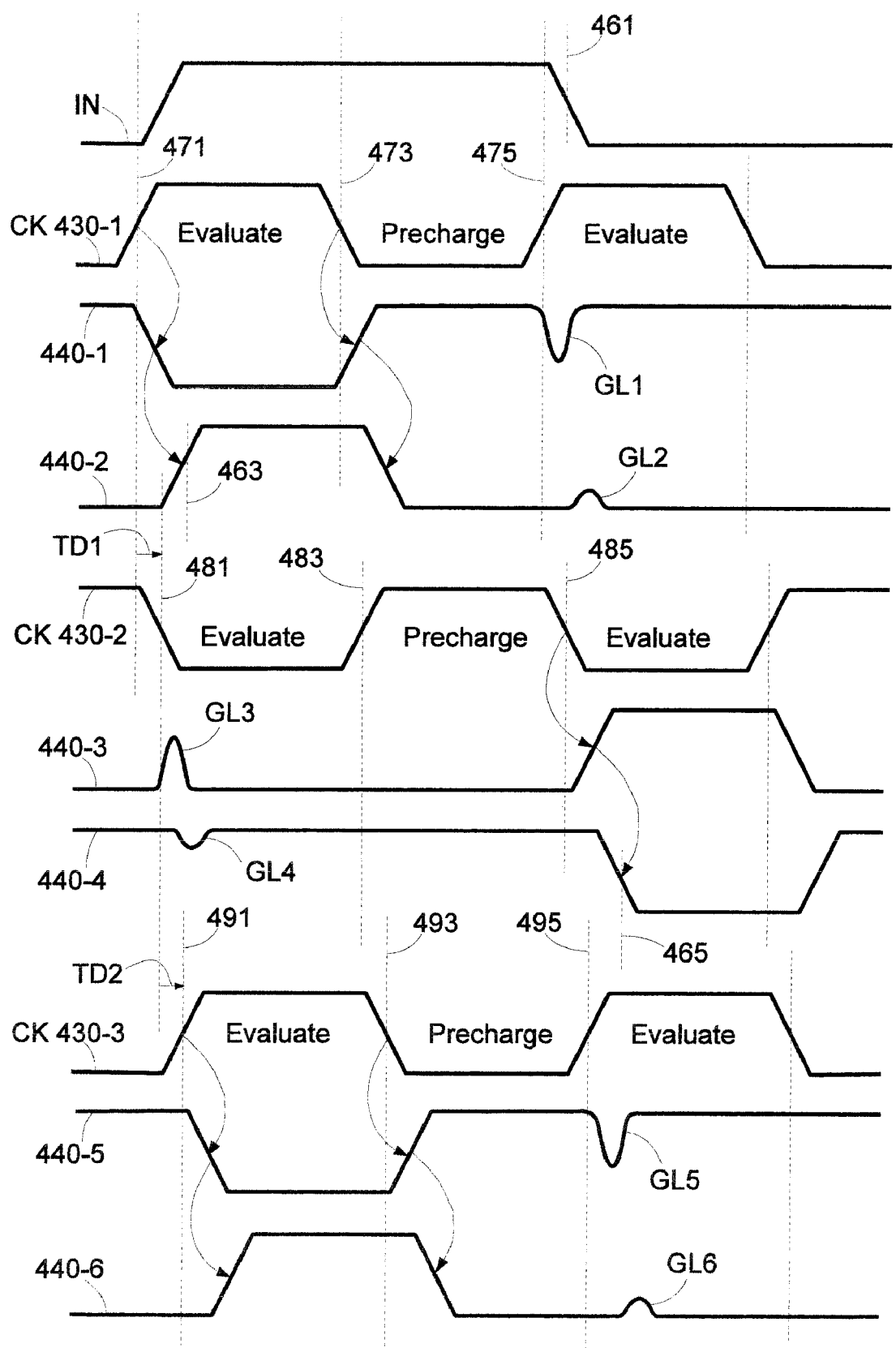
FIG. 4D illustrates a timing diagram demonstrating the operation of the multi-level Clock Guided Logic (CGL) circuit of FIG. 4B with further details regarding glitch reduction according to an exemplary embodiment of the invention.

FIG. 4D is similar to FIG. 4C except that extra details are added to illustrate the functioning of the 2-CGL signal path when the switching is avoided. As previously mentioned, when the clock input CK 430-1 edge 475 arrives at the EVH gate 410-1, the gate output 440-1 goes into the evaluate phase. However, there may be some small difference in time between when the clock CK 430-1 edge 475 arrives and when the input IN edge 461 (for example) arrives at the input of gate 410-1. Due to this difference in arrival times of clock edge 475 and data edge 461, there may be a glitch on the output 440-1 of gate 410-1. This glitch is shown in FIG. 4D as GL1. The glitch is formed when the clock edge 475 arrives, the input IN remains momentarily at logic 1. This causes the output 440-1 of EVH gate 410-1 to start switching from logic 1 to 0. However, after this period of time, the input IN switches fully to logic 0 and causes the output 440-1 of the gate 410-1 to recover back to logic 1. This glitch GL1 at the input of the REG gate 410-2 may cause the output of the gate 440-2 to glitch as well. The glitch GL2 at the output 440-2 is also shown in FIG. 4D.

However, the magnitude of the glitch GL2 at the output 440-2 of gate 410-2 is reduced compared to the glitch GL1 at the input of the gate 410-2. This reduction in glitch is because the REG gates have an inherent noise-rejection characteristic, and therefore, the gate 410-2 reduces the amount of glitch that propagates through to the output 440-2. Another reason for the reduced glitch GL2 at the output 440-2 is that the gate 410-2 starts to respond to the input glitch GL1 only after some delay and by that time the input glitch GL1 to the gate dies down causing the glitch GL1 to propagate only partially. This reduction in glitch propagation is one of the advantages of the CGL method since it uses the REG gates interleaved between the CGL gates. This reduction in glitch results into an overall improved reliability of the circuit. Again, the amount of the glitch can be controlled by modifying the difference in delay between the clock input and the data input to a CGL gate. This can be achieved by modifying clock propagation delay TD1 between clock edges 471 and 481 for example. Another way to control the glitching is to make the arrival time of the data input IN faster with respect to the clock input CK 430-1. Various other techniques can also be used in the field of art to control the arrival times of the data or clock signals to the CGL gates, and all such are contemplated to be within the teachings of this description.

Likewise, the glitch GL3 at the output 440-3 of the gate 410-3 maybe caused due to the difference in the arrival times of the clock input CK 430-2 edge 481 and the input data signal edge 463 (coming from output 440-2 of logic gate 410-2). The input data signal edge 463 may arrive at gate 410-3 after the clock 430-2 edge 481 arrives. In this case, the output 440-3 of gate 410-3 may start to switch from logic 0 to 1 when clock edge 481 arrives since the data input to the gate 410-3 is still at logic 0 while the output 440-2 is switching from 0 to 1. After this short period of time, the arrival of the data signal causes the output 440-3 of the gate 410-3 to recover back to logic 0 resulting in glitch GL3 at the output 440-3. The output 440-4 of gate 410-4 may also have a glitch GL4 as result of the input glitch GL3. As before, the glitch GL4 is reduced as compared to glitch GL3 when propagated through logic gate 410-4. This reduction in glitch is due the inherent noise rejection characteristic of the REG gate 410-4.

in a similar manner, the glitch GL5 at the downstream output 440-5 of gate 410-5 is caused by the data input edge 465 arriving slightly later than the clock CK 430-3 edge 495 at the gate input 410-5. As discussed above, the clock delays and signal delays may be chosen to yield the best results for any combination of circuit parameters including timing, power, area, and reliability. For example, the delays TD1 and TD2 can be adjusted by modifying the propagation delays of inverters 450-1, and 450-2 respectively. The propagation delays can be adjusted during or before the operation of the circuit by dynamically adjusting the clock delays, or by fixing the delays before the commencement of normal operation of the circuit. The clock delays can be designed and modified by employing various circuit techniques known in the art to adjust the clock delays.

II. 3-CGL Clock Guided Logic

Figure 5A:
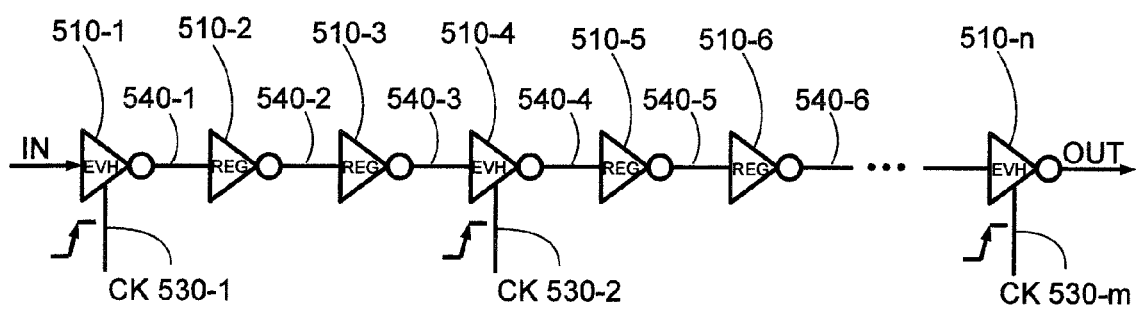
FIG. 5A illustrates a multi-level Clock Guided Logic (CGL) circuit with every 3rd logic gate clocked (3-CGL) according to an exemplary embodiment of the invention.

FIG. 5A illustrates a multi-level Clock Guided Logic (CGL) circuit with every 3rd logic gate clocked (3-CGL) according to an exemplary embodiment of the invention. FIG. 5A includes a series of inverters 510-1, 510-2, 510-3, 510-4, 510-5, 510-6, through 510-n from the input EN to the output OUT. Each of the series of inverters includes at least one output 540-1, 540-2, 540-3, 540-4, 540-5, 540-6, through 540-n respectively. Additionally, each of the CGL gates 510-1, 510-4, and 510-n includes a clock input CK 530-1, CK 530-2, through CK 530-m respectively.

Although inverters are described in the illustrated embodiment, gates 510-1 through 510-n may implement any arbitrary inverting logic functions having single or multiple inputs. For simplicity only one input per gate is shown. In the illustrated embodiment, the 3-CGL method is demonstrated where every 3rd logic gate uses an EVH-type gate. More specifically, logic gates 510-1, 510-4, through 510-(3n+1) (where, n=0, 1, 2, 3 . . . ,) are EVH type gates. All the remaining logic gates 510-2, 510-3, 510-5, 510-6, and so on, are the regular (REG) combinational logic gates. In at least certain embodiments, a series of logic gates, EVH-REG-REG-EVH-REG-REG-EVH- . . . , is formed in which every 3rd gate is an EVH gate. Alternatively, in the 3-CGL method, EVL-type gates may be used instead of EVH-type gates. The only difference being that the evaluate phase and the precharge phase will occur at opposite transitions of the clock. In the case where EVL-type gates are used instead of EVH-type gates, each logic function will evaluate when the clock input signal is driven to logic 0. In these embodiments, a series of logic gates, EVL-REG-REG-EVL-REG-REG-EVL- . . . , is formed in which every 3rd gate is an EVL gate.

In the illustrated embodiment, the multi-level path has the first element as EVH-type logic gate. However, this is given by way of illustration and not of limitation as circuit paths may begin with any type gate including EVH-type, EVL-type, or REG logic gates. That is, the teachings of this description include the sequence, EVH-REG-REG-EVH-REG-REG-EVH- . . . , or the sequence, EVL-REG-REG-EVL-REG-REG-EVL- . . . , beginning at any point in a signal path as long as subsequent logic gates follow the described sequence. Additionally, any portion of a signal path in an integrated circuit that includes this sequence is considered covered by the teachings of this description. This type of CGL circuit method is referred to as 3-CGL since every 3rd gate uses a CGL gate. For ease of understanding, the remaining part of the description of FIGS. 5A-5C discusses the 3-CGL method with only the EVH embodiment.

Figure 5B:
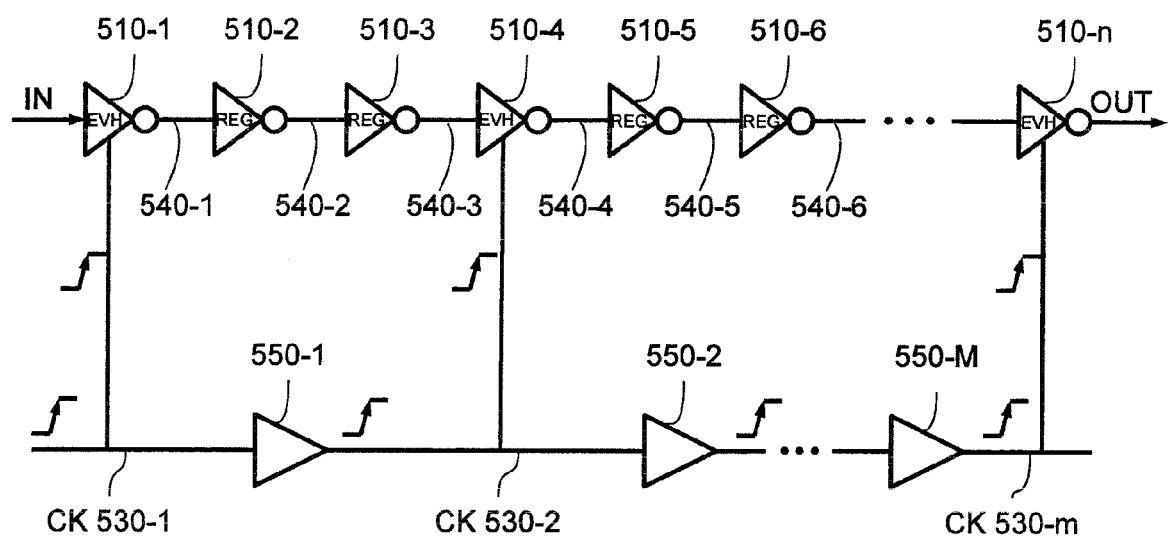
FIG. 5B illustrates further details of a multi-level Clock Guided Logic (CGL) circuit using 3-CGL according to an exemplary embodiment of the invention.

In the 3-CGL configuration and method, integrated circuit paths may be optimized so that switching delay is minimized. This is accomplished by configuring circuit paths of integrated circuits in the described manner so that the number of logic transitions required by the circuit path is reduced. In at least certain embodiments, the clock signals driving the EVH or EVL gates are delayed with a non-inverting relationship with respect to the clock signals driving the preceding EVH or EVL, gates. FIG. 5B illustrates a multilevel Clock Guided Logic (CGL) circuit using 3-CGL according to an exemplary embodiment of the invention. FIG. 5B includes a series of inverters 510-1, 510-2, 510-3, 510-4, 510-5, 510-6, through 510-n from the input IN to the output OUT. Each of the series of inverters includes an output 540-1, 540-2, 540-3, 540-4, 540-5, 540-6, through 540-n respectively. Additionally, each of the CGL gates 510-1, 510-4, through 510-n includes a clock input CK 530-1, CK 530-2, through CK 530-m respectively. In the illustrated embodiment, logic gates 510-1, 510-2, 510-3, through 510-n are inverters. However, in other embodiments logic gates 510-1, 510-2, 510-3, through 510-n may implement any arbitrary inverting logic functions having single or multiple inputs. For simplicity only one input per gate is shown. In the illustrated embodiment, every 3rd gate uses an EVH type gate. More specifically, logic gates 510-1, 510-4, through 510-(3n+1) (where, n=0, 1, 2, 3 . . . ) are EVH-type gates clocked by clock signals C'K 530-1, CK 530-2, through CK 530-m respectively. The remaining gates 510-2, 510-3, 510-5, 510-6, and so on, are REG combinational logic gates.

In FIG. 5B, clock signal CK 530-1 is a supplied clock (such as a system clock or external clock or from an internal clock tree network) and buffers 550-1, 550-2, through 550-m are connected in series to generate the clock signals CK 530-2, through CK 530-m from the supplied clock signal CK 530-1. In such an embodiment, clock signals may be generated with ease by using a simple chain of buffers connected together in series to form the clock path. Buffers are well-known circuit elements consisting of two inverters connected together in series. The simplicity and ease of clock generation is one of the advantages of the CGL method. The arrival times of the clock signals to the CGL gates may be chosen to facilitate the correct functioning and optimal performance of a multi-level circuit. For example, the clock delay can be adjusted by modifying the delays of the butters 550-1 and 550-2. The clock delays and signal path delays can be designed and modified by employing various circuit methods. The circuit shown in FIG. 5B is given by way of example and not of limitation as various other circuit techniques to generate clock signals are possible and contemplated within the teachings of this description.

During the precharge phase of the 3-CGL circuit shown in FIG. 5B, EVH gate outputs are precharged high (EVL gate outputs are precharged low). Further, the output 540-2 of the first downstream REG gate 510-2 following the EVH gate 510-1 is switched to logic 0 and the output 540-3 of the second downstream gate 510-3 following the EVH gate 510-1 is switched to logic 1. More specifically in FIG. 5B, logic gates 510-1, 510-4, through 510-(3n+1) (where, n=0, 1, 2, 3 . . . ) are precharged to 1. As a result of this precharging, gate outputs of logic gates 510-2, 510-5, . . . , 510-(3n+2) (where, n=0, 1, 2, 3, . . . ) are switched to 0 and gate outputs of logic gates 510-3, 510-6, . . . , 510-(3n+3) (where, n=0, 1, 2, 3, . . . ) are switched to 1.

During the evaluate phase, the clock signals (K 530-1, CK 530-2, through CK 530-m trigger the gates to evaluate one-by-one in sequence. The gate 510-1 may either transition to logic 0 or stay at logic 1 depending on the input(s) state. In the case where the input(s) IN is logic 1, the output 540-1 of logic gate 510-1 switches to 0, the output 540-2 of logic gate 510-2 switches to 1, and the output 540-3 of logic gate 510-3 switches to 0. However, since the gates 510-4, 510-5, and 510-6 are already at logic 1, 0 and 1 respectively due to an earlier precharge phase, there is no need for these gates to switch logic states. In the case where the input IN is at logic 0, the logic gate 510-1 does not require transition of the output because output 540-1 would already have been precharged to 1. Likewise, there is no need for gates 510-2 and 510-3 to switch logic states either. Since the second set of logic gates 510-4, 510-5, and 510-6 have outputs that are already precharged at logic level 1, 0, and 1 respectively, they will switch to 0, 1, and 0 respectively. In other words, either the first three gates 510-1, 510-2, and 510-3 switch logic states, or the second three gates 510-4, 510-5, and 510-6 switch logic states. By examining both cases, it can be seen that only about one half of the gate outputs need to switch. This reduction in the number of gate output transitions results in an optimization of the delay across the circuit. Thus, the 3-CGL method can utilize the EVL or EVH gates with the proper clock signal polarities to increase the speed of an integrated circuit.

Figure 5C:
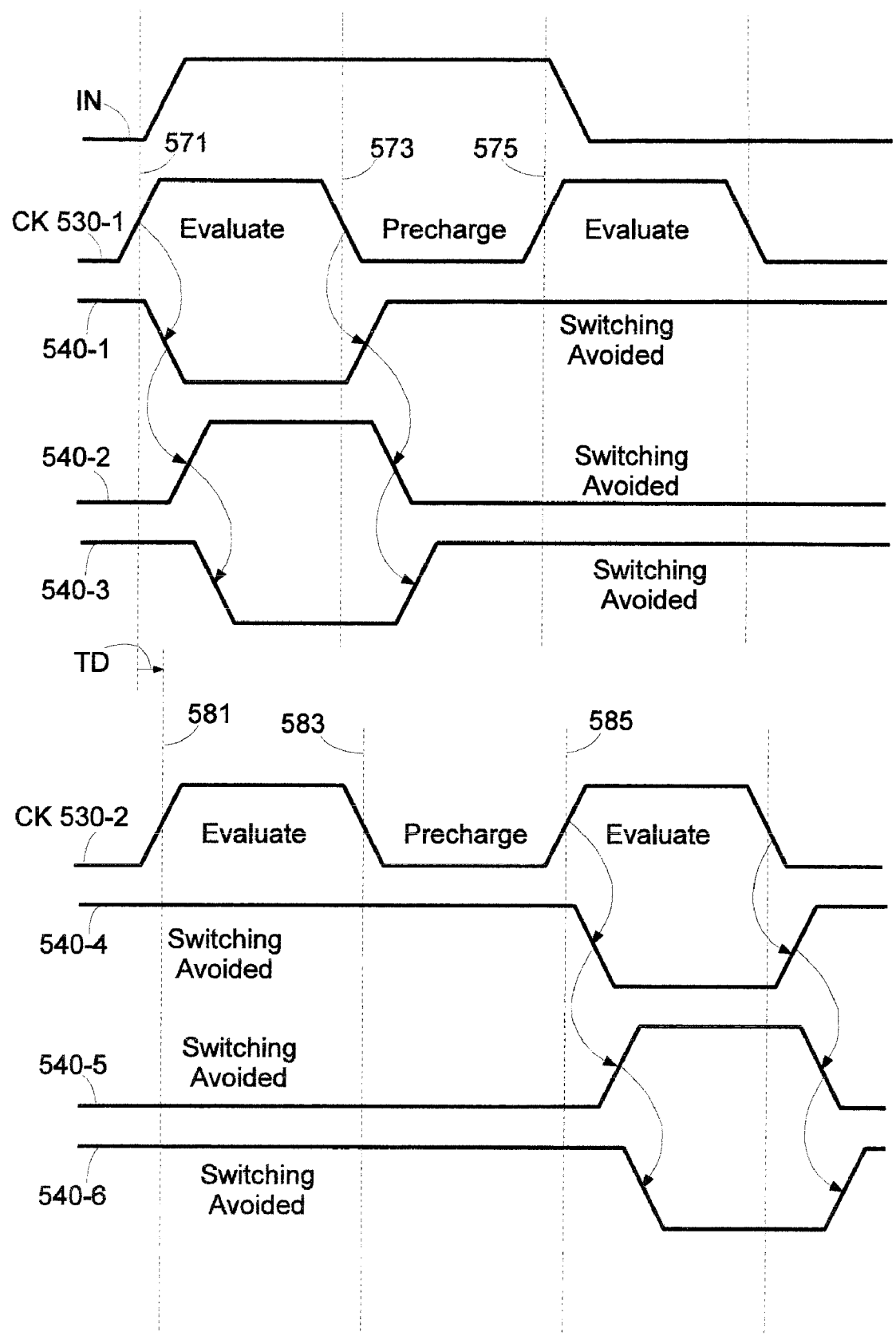
FIG. 5C illustrates a timing diagram demonstrating the operation of the multi-level Clock Guided Logic (CGL) circuit of FIG. 5B according to an exemplary embodiment of the invention.

The details of this process are shown in FIG. 5C, which illustrates a timing diagram demonstrating the operation of the multi-level Clock Guided Logic (CGL) circuit of FIG. 5B according to an exemplary embodiment of the invention. FIG.

5C includes the waveforms of clock signals CK 530-1 and CK 530-2, and the waveforms of outputs 540-1, 540-2, 540-2, 540-4, 540-5, and 540-6. At transition 571, the clock signal CK 530-1 clocking logic gate 510-1 switches from logic 0 to logic 1 placing logic gate 510-1 in the evaluate phase. Assuming the input IN transition from logic 0 to 1, the output 540-1 of EVH gate 510-1 will switch from logic 1 to 0, the output 540-2 of logic gate 510-2 will switch from logic 0 to 1, and the output 540-3 of logic gate 510-3 will switch from logic 1 to 0.

At transition 581, clock signal CK 530-2 clocking logic gate 510-4 switches from logic 0 to 1 placing logic gates 510-4, 510-5 and 510-6 of in the evaluate phase. As discussed above, there is a slight delay between the clock signals. This is shown as TD1 in FIG. 5C. Assuming an input IN transition from logic 0 to 1 at the input IN of logic gate 510-1, the input of logic gate 510-4 will be at logic 0 based on its position in the inverter chain (i.e., as input IN→1, 540-1→0, 540-2→1, 540-3→0). However, since the output 540-4 of gate 510-4 was already precharged to 1, there is no need for the output 540-4 to switch logic states. Therefore switching is avoided. Likewise, the following gates 510-5 and 510-6 are already at the appropriate logic state and will avoid switching.

At transition 573, clock signal CK 530-1 clocking logic gate 510-1 transitions from logic 1 to 0 and EVH gate 510-1 goes into the precharge phase, and therefore, switches from logic 0 to 1. Downstream logic gates will switch accordingly. However, at transition 575 of CK 530-1 when logic gate 510-1 returns to the evaluate phase, switching logic states at the output 540-1 will be avoided since EVH gate 510-1 was already precharged to the value of 1. Since the input IN is now switched to logic 0, there is no need for the output 540-1 to switch. Therefore, switching is avoided. Likewise, the downstream gates 510-2 and 510-3 avoid switching because they are already at the correct logic state based on the precharged output of EVH gate 510-1.

At transition 583, clock signal CK 530-2 clocking logic gate 510-4 transitions from logic 1 to 0, and EVH gate 510-4 goes into the precharge phase. Once again, switching is avoided because logic gate 510-4 is an EVH gate and EVH gates precharge to logic 1, and output 540-4 of EVH gate 510-4 was already at logic 1. Likewise, switching is avoided for gates 510-5 and 510-6. At transition 585, clock signal (CK 530-2 switches from logic 0 to 1. EVH gate 510-4 returns to the evaluate phase and the output 540-4 of logic gate 510-4 switches from logic 1 to 0 since the input to EVH gate 510-4 is at logic 1 based on the logic state of output 540-3 in the previous phase. Likewise, the output 540-5 of downstream logic gate 510-5 switches from logic 0 to 1 and the output 540-6 of downstream logic gate 510-6 switches from logic 1 to 0. In this manner, logic transitions are reduced by about one half according to principles of this description.

In this manner, the outputs 540-1, 540-2, 540-3, 540-4, 540-5, and 540-6 of logic gates 510-1, 510-2, 510-3, 510-4, 510-5 and 510-6 respectively are precharged in such a way so that either logic gates 510-1, 510-2, and 510-3 switch logic states during an evaluate phase or logic gates 510-4, 510-5 and 510-6 switch logic states during the same evaluate phase, but not both. In the illustrated embodiment, the outputs 540-1, 540-2 and 540-3 of logic gates 510-1, 510-2 and 510-3 respectively are precharged so that logic gates 510-1, 510-2 and 510-3 switch logic states during the evaluate phase at transition 571 of CK 530-1 and avoid switching logic states during the next evaluate phase at transition 575 of CK 530-1. Likewise, the outputs 540-4, 540-5 and 540-6 of logic gates 510-4, 510-5 and 510-6 respectively are precharged so that logic gates 510-4, 510-5 and 510-6 avoid switching logic states during the evaluate phase at transition 581 of CK 530-2 and switch logic states during the next evaluate phase at transition 585 of CK 530-2.

Again some glitching may occur at the output of the gates during the evaluation phase as described before due to difference in arrival time between clock and data. The glitch is reduced due to the interleaved REG gates that follow the CGL gates. This is one of the advantages of the CGL method. Further as described before, the clock delays (e.g., TD in FIG. 5C) between successive stages can be modified by various means for addressing any combination of design goals including delay, reliability, power, or area. Such delay modification schemes are contemplated within the teachings of this description.

In this manner, critical path delays in integrated circuits may be optimized to reduce or minimize switching. It should be noted that the logic switching illustrated and discussed with respect to FIGS. 4A-4C and 5A-5C is only given by way of illustration and not of limitation. EVH and EVL gates may be any type of arbitrary logic gates implementing any arbitrary logic functions. Accordingly, EVH and EVL gates may be multiple input gates such as NAND gates, NOR gates, and etcetera. FIGS. 4A-C and 5A-C included inverters for illustration purposes. Since inverters are single-input logic gates, they always switch whenever their input switches because of the direct inverting relationship between the input and the output of an inverter logic gate. However, since NAND gates, NOR gates, and etcetera are multiple-input logic gates; each of these multiple-input gates may or may not switch depending on the logic states of each of the multiple inputs. Multiple-input logic gates may or may not switch depending on the configuration of inputs. That is, depending on the inputs to the EVH and EVL gates, the gates may or may not switch as shown in FIGS. 4A-C and 5A-C.

Each of these multiple-input gates can be said to potentially switch during an evaluate phase. This means, depending on the logic states of the various inputs of the multiple-input logic gates, the gates may potentially switch during the evaluate phase. This potential for switching during the evaluate phase may be referred to as sensitizing the output. An input sensitizes a given output whenever a logic transition at the input produces a corresponding logic transition at the output for a given configuration of side-inputs. If the side-inputs are configured in such a way that a transition in the clock input produces a transition at the output of a particular logic gate, then the output of that logic gate is said to the sensitized by the clock input. So, whenever the clock input is asserted with respect to a CGL gate, the clock input sensitizes the output of the CGL gate because there is at least one configuration of inputs that would produce a logic transition at the output for each of these multiple-input CGL gates. Similarly, this also holds for REG combinational logic gates.

Figure 6A:
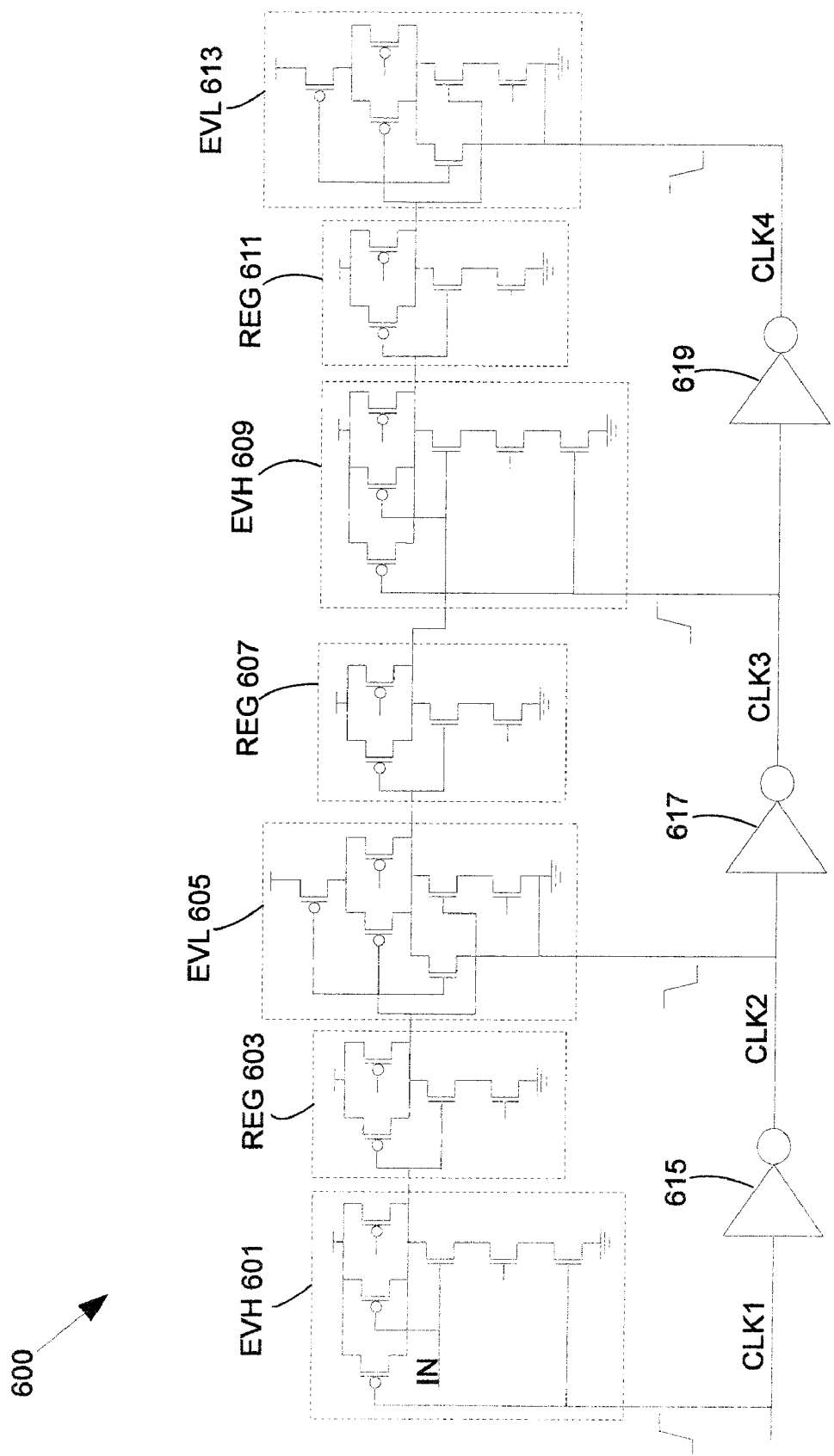
FIG. 6A illustrates a multi-level circuit implementation of a series of 2-input NAND gates (NAND2) using 2-CGL according to an exemplary embodiment of the invention.
Figure 6B:
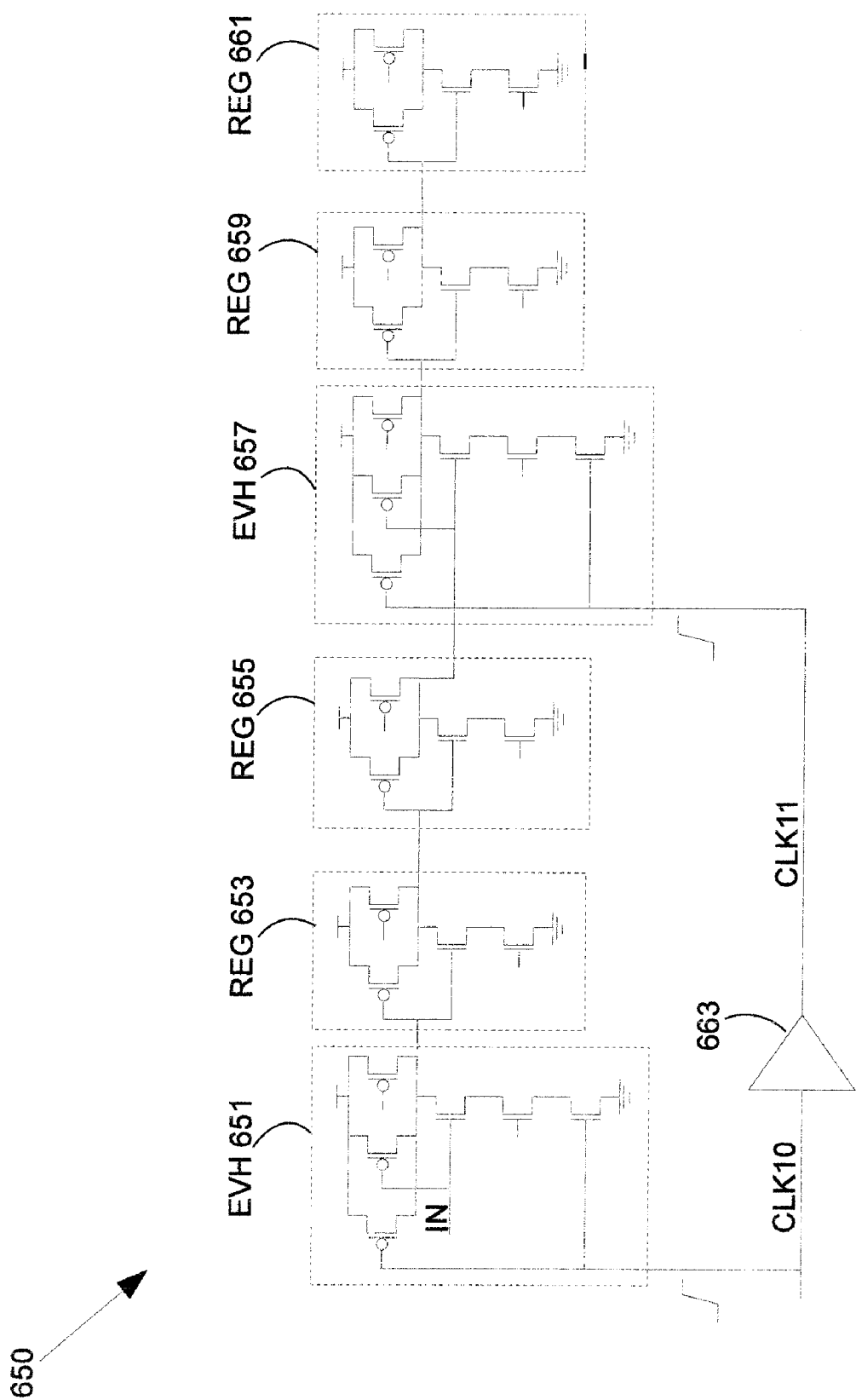
FIG. 6B illustrates a multi-level circuit implementation of a series of 2-input NAND gates (NAND2) using 3-CGL according to an exemplary embodiment of the invention.

FIG. 6A illustrates a multi-level circuit implementation of a series of 2-input NAND gates (NAND2) using the 2-CGL method according to an exemplary embodiment of the invention. Circuit 600 demonstrates a signal path including EVH NAND2 gate 601, REG NAND2 gate 603, EVL NAND2 gate 605, REG NAND2 gate 607, EVH NAND2 gate 609 REG NAND2 gate 611, and EVL NAND2 gate 613. Additionally, circuit 600 is clocked using various clocks driven by inverters 615, 617, and 619 including CLK 1 driving EVH gate 601, CLK-2 driving EVL gate 605, CLK3 driving EVH gate 609, and CLK4 driving EVL gate 613. Likewise, FIG. 6B illustrates a multi-level circuit implementation of a series of 2-input NAND (NAND2) gates using the 3-CGL method according to an exemplary embodiment of the invention. Circuit 650 demonstrates a signal path including EVH NAND2 gate 651, REG NAND2 gates 653 and 655, EVH NAND2 gate 657, and REG NAND2 gates 659 and 661. Additionally, circuit 650 is clocked using various clocks driven by buffer 663 including CLK10 driving EVH 651 and CLK11 driving EVH 657. For simplicity, in FIG. 6A and FIG. 6B, other inputs to the NAND2 gates are not shown as connected.

One of the features that FIG. 6A and FIG. 6B demonstrates is that EVH, EVL, and REG gates are built from circuit transistors and are connected together in series to form a multilevel circuit. The use of the term gate to refer to various circuit elements (e.g., EVH gate, EVL gate, CGL gate, or REG gate) is given by way of illustration and not of limitation. Logic gates can be represented as non-inverting logic gates since non-inverting gates are two inverting gates connected together in series. For example in OR gate can be a NOIR gate followed in series connection by an inverter (INV) gate. Any such gate or circuit level representations are contemplated within the teachings of this description.

III. Generalization of the Clock Guided Logic to N-CGL

The Clock Guided Logic (CGL) methods described in above can be extended to every Nth logic gate (N is any positive integer greater than 1) where each Nth logic gate is a CGL gate clocked with appropriate clock signal polarity and delay to yield the best circuit optimization for any combination of circuit parameters including timing, power, area and reliability. The family of Clock Guided Logic with every Nth gate precharged is denoted as N-CGL. This nomenclature supports the 2-CGL circuit illustration shown in FIGS. 4A-4C (i.e., every 2nd gate uses a CGL gate) and the 3-CGL circuit illustration shown in FIGS. 5A-5C (i.e., every 3rd gate uses a CGL gate). Therefore, when designing electronic circuits, speed paths may utilize one or more of the 2-CGL, 3-CGL, through N-CGL methods in order to reduce switching delay in critical paths (where, N=2, 3, 4 . . . ).

Another thing to be noticed in N-CGL is that if N is an even number, the successive clock signal polarities are inverting, and if N is an odd number, the successive clock signal polarities are non-inverting. For example, in 2-CGL method shown in FIG. 4B, the successive clock signals are generated using inverters and in 3-CGL method shown in FIG. 5B, the successive clock signals are generated using buffers. Another interesting characteristic of the family of Clock Guided Logic is that the delay between successive clock (or guide) signals that yields best delay optimization (Best Guide Delay) increases as N is increased in N-CGL. For example, the Best Guide Delay for 3-CGL may be higher than 2-CGL and so forth.

Further the meaning of the EVH gates can be generalized to include any logical element with an arbitrary function having one or more inputs and one or more outputs that exhibits a state of pre-conditioning (i.e., precharging) to a logic state 1 and a state of evaluation in which output(s) evaluate in response to a cyclical phase input such as a clock signal. Likewise, the meaning of the EVL gates can be generalized to include any logical element with arbitrary function having one or more inputs and one or more outputs that exhibits a state of pre-conditioning (i.e., precharging) to a logic state 0 and a state of evaluation in which output(s) evaluate in response to a cyclical phase input such as a clock.

Figure 7:
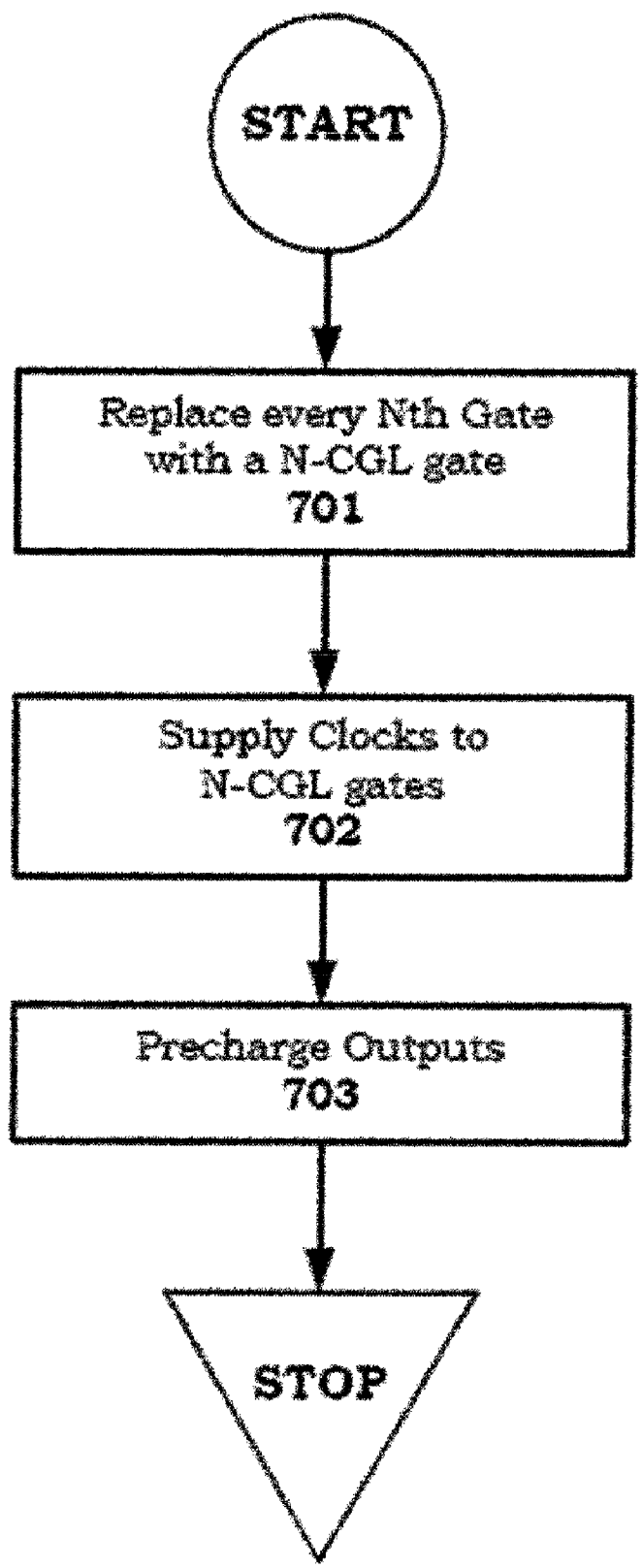
FIG. 7 illustrates a method of optimizing an integrated circuit according to an exemplary embodiment of the invention.

FIG. 7 illustrates a method of optimizing an integrated circuit according to an exemplary embodiment of the invention. The exemplary method begins by replacing every Nth logic gate in an integrated circuit signal path with an N-CGL gate (operation 701). Then clocks are supplied to the N-CGL gates (operation 702) and the outputs of the N-CGL gates are precharged (operation 703) such that either the first N gates in the integrated circuit switch logic states during the evaluate phase of a clock signal and a second N gates avoid switching logic states during the evaluate phase, or the first N gates in the circuit avoid switching logic states during the evaluate phase of the clock signal and the second N gates switch logic states during the evaluate phase.

IV. Variations in the Methods of the Clock Guided Logic

In circuit paths it is possible to mix more than one type of CGL method together. For example, it is possible that part of the circuit path uses 2-CGL method and the other part uses 3-CGL method as long as clock signals with proper polarities and delays are provided. Mixing the 2-CGL or 3-CGL schemes in a path can be useful where flexibility of clocking the circuit is needed. Also in FIG. 2 and FIG. 3 the keeper portions 210 and 320 respectively can be modified to use either dynamic keeper or pseudo-NMOS or pseudo-PMOS type circuit. It is possible to use the dynamic or pseudo-NMOS or pseudo-PMOS circuits not only in the EVH and EVL type gates but also in the regular REG CMOS gates that follow EVL and EVH gates with correct polarities of clock signals to precharge the gates either low or high. Dynamic and pseudo-NMOS or pseudo-PMOS type gates are contemplated as included within the teachings of this description. Further it is possible to have multiple outputs in a CGL-type gate. An example of multiple output logic gates is given by a logic family called Differential Cascade Voltage Switch (DCVS). The DCVS-type logic gates can also be used for EVH, EVL, and REG logic gates. Use of such type of logic gates or any other type of logic gates having multiple inputs and multiple outputs is also contemplated within the teachings of this description.

Figure 8:
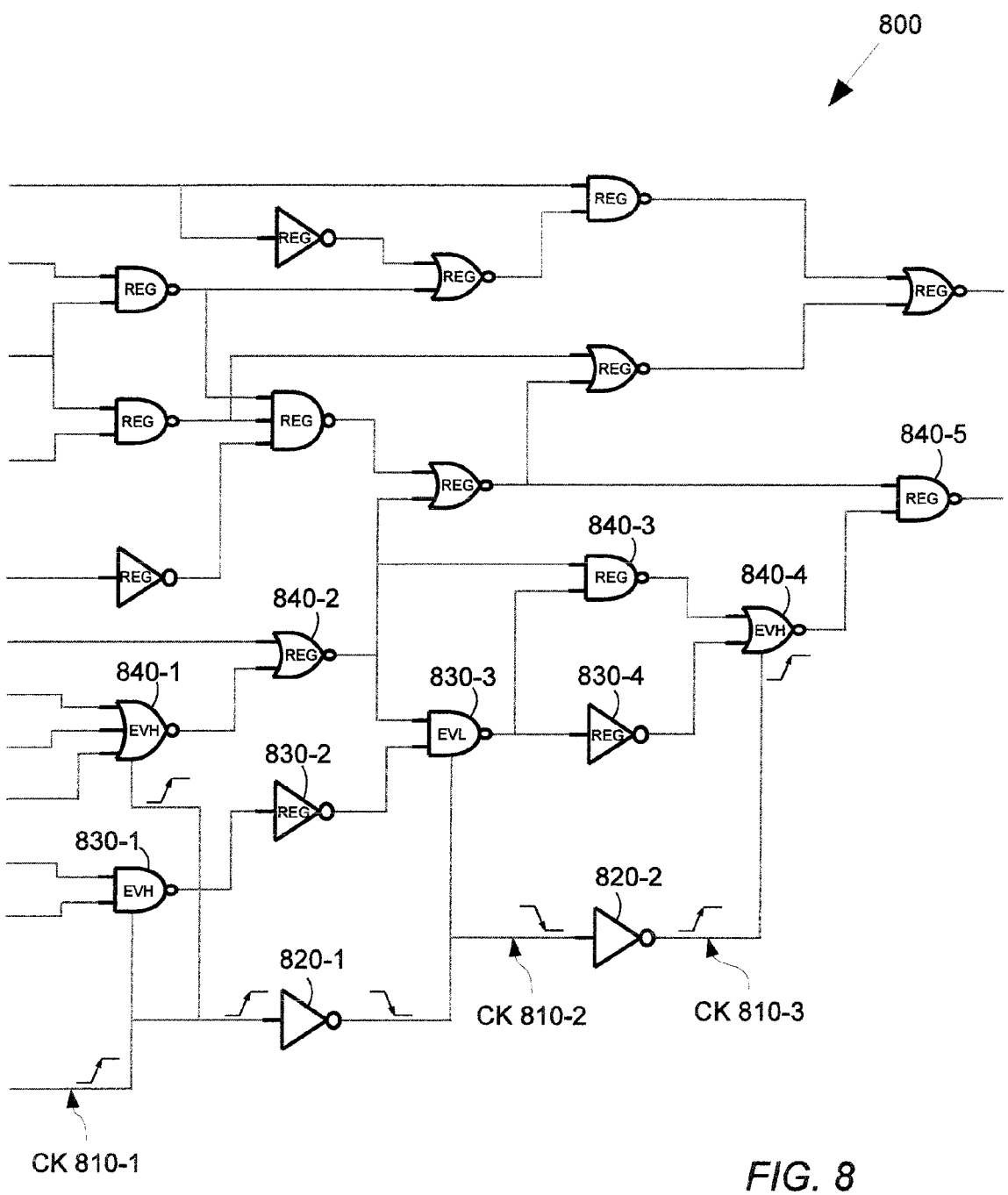
FIG. 8 illustrates a portion of an integrated circuit with multiple levels of logic using the Clock Guided Logic (CGL) method according to an exemplary; embodiment of the invention.

FIG. 8 illustrates a portion of an integrated circuit with multiple levels of logic using the Clock Guided Logic (CGL) method according to an exemplary embodiment of the invention. Circuit 800 shows the use of CGL gates in multiple paths that are coupled together in various ways. Gates 830-1, 840-1, and 840-4 are EVH gates. Gate 830-3 is an EVL gate. The clock signal CK 810-1 is supplied to the EVH gates 830-1 and 840-1. Clock signals CK 810-2 and CK 810-3 are generated by series inverters 820-1 and 820-2 respectively and drive the CGL gate inputs of 830-3 and 840-4. Gates 830-2, 840-2, 830-4, 840-3, and 840-5 are REG gates. All the other gates are not part of CGL signal paths, but are shown to illustrate that not all paths in a design need to use CGL method. A careful observation of multilevel circuit design 800 reveals that different signal paths are using 2-CGL or 3-CGL methods. For example, gates 830-1 (EVH), 830-2 (REG), 830-3 (EVL), 830-4 (REG), 840-4 (EVH), and 840-5 (REG) form a signal path that uses the 2-CGL method. In another example, gates 840-1 (EVH), 840-2 (REG), 840-3 (REG), 840-4 (EVH), and 840-5 (REG) are part of a signal path that uses the 3-CGL method. It can be observed that gates 840-4 and 840-5 are common to both these two signal paths. Also in the 3-CGL path, gates 840-1 and 840-4 are clocked by clock signals CK 810-1 and CK 810-3 respectively. These clock signals are in a non-inverting relationship since clock signal CK 810-3 is generated from CK 810-1 by two inverters 820-1 and 820-2 connected in series. Yet another example path is given by gates 840-1 (EVH), 840-2 (REG), 830-3 (EVL), 830-4 (REG), 840-4 (EVH), 840-5 (REG) that uses 2-CGL method. Again, the use of common gates 830-3 and 830-4 in two partially merged paths is evident. The example design 800 illustrates that more than one type of CGL (e.g., 2-CGL or 3-CGL) method can be used at the same time in a single circuit. Different path using different CGL methods can merge together, bifurcate, or cross each other. Also, part of a signal path can use one CGL method, and another part can use another CGL method.

Additionally, for the purpose of simplicity all the gates used in FIG. 8 are shown as having inverting functionality. However, this is only presented as an example and not a limitation. EVH gate 830-1 (NAND) and REG gate 830-2 (INV) can be combined together in a logic representation and can be shown as an AND gate with a clock input CK 810-1. Such a gate is an EVH gate with NAND functionality toll owed by a REPS gate with inverting functionality (i.e., INV) connected in series. Any such gate level representation to combine multiple circuit stage functionalities is contemplated within the teachings of this description.

In this manner, critical path delays in integrated circuits may be optimized to reduce or minimize switching. This is advantageous for many reasons including performance gains in a circuit utilizing the methods and apparatuses described herein. One such advantage is frequency increases due to reduced switching delay in critical paths of an integrated circuit. The N-CGL method has the advantage that noise and glitch propagation are mitigated from stage to stage. Because the N-CGL method includes REG gates between the modified CGL gates, there is a certain amount of noise-rejection that occurs. Any degradation in signal quality from the output of a CGL gate will also be improved when it passes through the downstream REG gates.

Additionally the N-CGL method allows for easy administration of clock paths. The clocks need only be driven by a series of inverters (or buffers in the N-CGL cases where N is odd). Thus, it is easy to tailor the arrival times of the clock signals to coincide with the setup and hold times of the signals propagating through the signal paths. Thus, when a clock signal is needed, it can be provided in a simple and efficient manner under the principles of this description. There is no need for elaborate clocking schemes with delay locked loops or sophisticated clock delay structures. This invention overcomes some of the limitations of previous solutions. The methods and apparatuses described herein have a high level of reliability as compared to other methodologies utilized to increase operating frequency of an integrated circuit. The logic structure of this invention is amenable to much simpler clock generation circuits. Also the reliability is improved considerably by the use of CMOS logic gates used in between the clocked logic gates that mitigate any glitching or noise from previous precharged stages.

For the design of digital integrated circuits (e.g., on the scale of Very Large Scale Integration (VLSI) technology), designers often employ computer-aided techniques. Standard languages such is Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

The teachings of this description are applicable to every level of integrated circuit design and implementation. That is, the teachings of this description may be implemented at any level of integrated circuit design and implementation including one or more of the following: high-level descriptions such as chip-level or system-level; embedded system level; software subroutine level; mapped netlist level; Register Transfer Logic (RTL) level; Hardware Description Language (HDL) level; schematic level: technology-independent gate level; technology-dependent gate level; circuit floorplan level; circuit layout level; packaged IC components level; and hardware implementation level and etcetera.

Throughout the foregoing specification, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. When a particular feature, structure, or characteristic is described in connection with an embodiment, it is submitted that it is within the knowledge of one skilled in the art to bring about such a feature, structure, or characteristic in connection with other embodiments whether or not explicitly described. Various changes may be made in the structure and embodiments shown herein without departing from the principles of the invention. Further, features of the embodiments shown in various figures may be employed in combination with embodiments shown in other figures.

In the description as set forth above and claims, the terms "coupled" and "connected," along with their derivatives, may be used. It should be understood that these terms are not intended to be synonymous with each other. Rather, in particular embodiments, "connected" is used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

Some portions of the detailed description as set forth above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion as set forth above, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention also relates to apparatus for performing the operations herein. This apparatus may be specially constructed for the required purposes, or it may comprise a general purpose computer selectively activated or reconfigured by a computer program stored in the computer. Such a computer program may be stored or transmitted in a machine-readable medium, such as, but is not limited to, a machine-readable storage medium (e.g., any type of disk including floppy disks, optical disks, CD-ROMs, and magnetic-optical disks, read-only memories (ROMs), random access memories (RAMs), EPROMs, EEPROMs, flash memory, magnetic or optical cards, or any type of media suitable for storing electronic instructions), or a machine-readable transmission medium such as, but not limited to, any type of electrical, optical, acoustical or other form of propagated signals (e.g., carrier waves, infrared signals, digital signals, etc.).

The algorithms and displays presented herein are not inherently related to any particular computer system or other apparatus, Various general purpose systems may be used with programs in accordance with the teachings herein, or it may prove convenient to construct more specialized apparatuses to perform the method operations. The structure for a variety of these systems appears from the description above. In addition, the invention is not described with reference to any particular programming language. It will be appreciated that a variety of programming languages may be used to implement the teachings of the invention as described herein.

Embodiments of the invention may include various operations as set forth above or fewer operations or more operations or operations in an order which is different from the order described herein. The operations may be embodied in machine-executable instructions which cause a general-purpose or special-purpose processor to perform certain operations. Alternatively, these operations may be performed by specific hardware components that contain hardwired logic for performing the operations, or by any combination of programmed computer components and custom hardware components.

Throughout the foregoing description, for the purposes of explanation, numerous specific details were set forth in order to provide a thorough understanding of the invention. It will be apparent, however, to one skilled in the art that the invention may be practiced without some of these specific details. Accordingly, the scope and spirit of the invention should be judged in terms of the claims which follow as well as the legal equivalents thereof.

What is claimed is:

1. An integrated circuit to optimize path switching delay comprising any portion of a signal path in which every Nth logic stage is a Clock Guided Logic (CGL) element for an integer N greater than 1, wherein the CGL element comprises either an evaluate-high (EVH) element or evaluate-low (EVL) element, and wherein the CGL element alternates between an EVH element and an EVL element in cases where N is even, and the CGL element is either exclusively an EVH element or exclusively an EVL element in cases where the N is odd.

2. The integrated circuit of claim 1, wherein the CGL element further comprises:
   a clock input; and
   a precharge circuit coupled with the clock input to precharge an output of the CGL element so that either a first N elements in the signal path are sensitized to switch logic states during an evaluate phase of a clock input and a second N elements avoid switching logic states during the evaluate phase, or the first N elements in the signal path avoid switching logic states during the evaluate phase of the clock input and the second N elements are sensitized to switch logic states during the evaluate phase.

3. The integrated circuit of claim 2, wherein a logic function of the EVH element evaluates during a high-phase of the clock input and an output of the EVH element precharges during a low-phase of the clock input, and wherein a logic function of the EVL element evaluates during a low-phase of the clock input and an output of the EVL element precharges during a high-phase of the clock input.

4. The integrated circuit of claim 3, wherein the clock input driving the CGL element is delayed in an inverting relationship with respect to a clock input driving the respective CGL element in a preceding stage in the cases where N is even, and the clock input driving the CGL element is delayed in a non-inverting relationship with respect to a clock input driving the respective CGL element in a preceding stage in cases where N is odd.

5. The integrated circuit of claim 4, wherein a clock path delay of the clock input is adjusted to optimize an arrival time of the clock input to the CGL element to improve one or more parameters including timing, power, reliability and area.

6. The integrated circuit of claim 5, wherein the clock input is supplied using a series of connected inverters in a clock path in cases where N is even, and using a series of connected buffers in the clock path in cases where N is odd.

7. The integrated circuit of claim 1, wherein the signal path further comprises a first segment and a second segment, wherein every Jth logic element in the first segment of the signal path is a CGL element, and every Kth logic element in the second segment of the signal path is a CGL element for any integers J and K greater than 1 with J not equal to K.

8. A method to optimize path switching delay comprising:
   instantiating a Clock Guided Logic (CGL) element at every Nth logic stage in any portion of a signal path in an integrated circuit for an integer N greater than 1, wherein the CGL element comprises either an evaluate-high (EVH) element or evaluate-low (EVL) element, and wherein the instantiating includes alternating between an EVH and an EVL in cases where N is even, and instantiating either exclusively an EVH element or exclusively an EVL element in cases where N is odd;
   supplying a clock input to the CGL element; and
   precharging an output of the CGL element so that either a first N elements in the signal path are sensitized to switch logic states during an evaluate phase of a clock input and a second N elements avoid switching logic states during the evaluate phase, or the first N elements in the signal path avoid switching logic states during the evaluate phase of the clock input and the second N elements are sensitized to switch logic states during the evaluate phase.

9. The method of claim 8, wherein a logic function of the EVH element evaluates during a high-phase of the clock input and an output of the EVH element precharges during a low-phase of the clock input, and wherein a logic function of the EVL element evaluates during a low-phase of the clock input and an output of the EVL element precharges during a high-phase of the clock input.

10. The method of claim 9, wherein the clock input driving the CGL element is delayed in an inverting relationship with respect to a clock input driving the respective CGL element in a preceding stage in the cases where N is even, and the clock input driving the CGL element is delayed in a non-inverting relationship with respect to a clock input driving the respective CGL element in a preceding stage in cases where N is odd.

11. The method of claim 10, wherein a clock path delay of the clock input is adjusted to optimize an arrival time of the clock input to the CGL element to improve one or more parameters including timing, power, reliability and area.

12. The method of claim 11, wherein the clock input is supplied using a series of connected inverters in a clock path in cases where N is even, and using a series of connected buffers in the clock path in cases where N is odd.

13. The method of claim 11, wherein the clock path delay is adjusted in one or more ways including dynamically adjusted during operation of the integrated circuit, and statically adjusted before operation of the integrated circuit.

14. The method of claim 8, wherein the signal path further comprises a first segment and a second segment, wherein every Jth logic element in the first segment of the signal path is a CGL element and every Kth logic element in the second segment of the signal path is a CGL element for any integers J and K greater than 1 with J not equal to K.

15. An integrated circuit to optimize path switching delay comprising any portion of a signal path in which every Nth logic stage is a Clock Guided Logic (CGL) element for an integer N greater than 1, wherein the CGL element includes a precharge circuit to precharge outputs of the CGL element so that either a first N elements in the signal path are sensitized to switch logic states during an evaluate phase of a clock input and a second N elements avoid switching logic states during the evaluate phase, or the first N elements in the signal path avoid switching logic states during the evaluate phase of the clock input and the second N elements are sensitized to switch logic states during the evaluate phase.

16. The integrated circuit of claim 15, wherein the CGL element comprises either an evaluate-high (EVH) element or evaluate-low (EVL) element, and wherein the CGL element alternates between an EVH element and an EVL element in cases where N is even, and the CGL element is either exclusively an EVH element or exclusively an EVL element in cases where the N is odd.

17. The integrated circuit of claim 16, wherein a logic function of the EVH element evaluates during a high-phase of the clock input and an output of the EVH element precharges during a low-phase of the clock input, and wherein a logic function of the EVL element evaluates during a low-phase of the clock input and an output of the EVL element precharges during a high-phase of the clock input.

18. A method to optimize path switching delay comprising:
  instantiating a Clock Guided Logic (CGL) element at every Nth logic stage in any portion of a signal path in an integrated circuit for an integer N greater than 1; and
  precharging an output of each CGL element so that either a first N elements in the signal path are sensitized to switch logic states during an evaluate phase of a clock input and a second N elements avoid switching logic states during the evaluate phase, or the first N elements in the signal path avoid switching logic states during the evaluate phase of the clock input and the second N elements are sensitized to switch logic states during the evaluate phase.

19. The method of claim 8, wherein the CGL element comprises either an evaluate-high (EVH) element or evaluate-low (EVL) element, and wherein a logic function of the EVH element evaluates during a high-phase of the clock input and an output of the EVH element precharges during a low-phase of the clock input, and wherein a logic function of the EVL element evaluates during a low-phase of the clock input and an output of the EVL element precharges during a high-phase of the clock input.

20. The method of claim 19, further comprising:
  alternating between instantiating an EVH element and an EVL element at every Nth logic stage in the signal path in cases where N is even; and
  instantiating either exclusively an EVH element or exclusively an EVL element at every Nth logic stage in cases where N is odd.

21. A computer-readable storage media that provides instructions, which when executed by a computer, cause the computer to perform a method to optimize path switching delay, the method comprising instantiating a Clock Guided Logic (CGL) element at every Nth logic stage in any portion of a signal path in all integrated circuit for an integer N greater than 1, wherein the CGL element comprises either an evaluate-high (EVH) element or evaluate-low (EVL) element, and wherein the instantiating includes alternating between an EVH and an EVL in cases where N is even, and instantiating either exclusively an EVH element or exclusively an EVL element in cases where N is odd;
  supplying a clock input to the CGL element; and
  precharging an output of the CGL element so that either a first N elements in the signal path are sensitized to switch logic states during an evaluate phase of a clock input and a second N elements avoid switching logic states during the evaluate phase, or the first N elements in the signal path avoid switching logic states during the evaluate phase of the clock input and the second N elements are sensitized to switch logic states during the evaluate phase.

22. A computer-readable storage media that provides instructions, which when executed by a computer, cause the computer to perform a method to optimize path switching delay comprising:
  instantiating a Clock Guided Logic (CGL) element at every Nth logic stage in any portion of a signal path in an integrated circuit for an integer N greater than 1; and
  precharging outputs of the CGL element so that either a first N elements in the signal path are sensitized to switch logic states during an evaluate phase of a clock input and a second N elements avoid switching logic states during the evaluate phase, or the first N elements in the signal path avoid switching logic states during the evaluate phase of the clock input and the second N elements are sensitized to switch logic states during the evaluate phase.

23. The computer-readable storage media of claim 22, wherein the CGL element comprises either an evaluate-high (EVH) element or evaluate-low (EVL) element, and wherein a logic function of the EVH element evaluates during a high-phase of the clock input and an output of the EVH element precharges during a low-phase of the clock input, and wherein a logic function of the EVL element evaluates during a low-phase of the clock input and an output of the EVL element precharges during a high-phase of the clock input.

24. The computer-readable storage media of claim 23, further comprising:
   alternating between instantiating an EVH element and an EVL element at every Nth logic stage in the signal path in cases where N is even; and
   instantiating either exclusively an EVH element or exclusively an EVL element in cases where N is odd.

25. An apparatus to optimizing switching delay comprising a means for instantiating a Clock Guided Logic (CGL) element at every Nth logic stage in any portion a signal path in an integrated circuit for an integer N greater than 1, wherein the CGL, element comprises either an evaluate-high (EVH) element or evaluate-low (EVL) element, and wherein the instantiating includes alternating between an EVH and an EVL in cases where N is even, and instantiating either exclusively an EVH element or exclusively an EVL element in cases where N is odd.

* * * * *